United States Patent
Fukuzawa et al.

(10) Patent No.: US 7,786,918 B2
(45) Date of Patent: Aug. 31, 2010

(54) A/D CONVERSION CIRCUIT AND ELECTRONIC INSTRUMENT

(75) Inventors: Akihiro Fukuzawa, Hino (JP); Nobuyuki Imai, Shiojiri (JP); Satoru Ito, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 63 days.

(21) Appl. No.: 12/338,547

(22) Filed: Dec. 18, 2008

(65) Prior Publication Data

US 2009/0160692 A1   Jun. 25, 2009

(30) Foreign Application Priority Data

Dec. 19, 2007   (JP) .............................. 2007-327357

(51) Int. Cl.
  *H03M 1/12*   (2006.01)
(52) U.S. Cl. ...................... 341/155; 341/118; 341/139; 341/140; 341/141
(58) Field of Classification Search ................. 341/118, 341/120, 131, 132, 139, 140, 141, 155
See application file for complete search history.

(56) References Cited

U.S. PATENT DOCUMENTS

| | | | | |
|---|---|---|---|---|
| 3,603,972 | A * | 9/1971 | Vanderford | ................. 341/139 |
| 3,813,609 | A * | 5/1974 | Wilkes et al. | ................. 330/51 |
| 4,823,129 | A * | 4/1989 | Nelson | ........................ 341/139 |
| 6,073,848 | A * | 6/2000 | Giebel | .................... 235/462.26 |
| 6,369,739 | B1 * | 4/2002 | Inada et al. | ................. 341/155 |
| 6,674,388 | B2 * | 1/2004 | Mulder | ........................ 341/158 |
| 7,042,285 | B2 * | 5/2006 | Parkhurst et al. | ............. 330/140 |
| 7,312,732 | B2 * | 12/2007 | Engl | ............................ 341/118 |
| 7,403,010 | B1 * | 7/2008 | Hertz | ........................... 324/318 |
| 7,616,052 | B1 * | 11/2009 | Ju et al. | ....................... 327/552 |
| 7,667,176 | B2 * | 2/2010 | Olsen et al. | ............... 250/208.1 |
| 2007/0257830 | A1 * | 11/2007 | Savage et al. | ................ 341/168 |
| 2010/0052958 | A1 * | 3/2010 | Roeven et al. | ............... 341/139 |

FOREIGN PATENT DOCUMENTS

| | | |
|---|---|---|
| JP | A-53-94813 | 8/1978 |
| JP | A-2-246943 | 10/1990 |
| JP | A-9-229823 | 9/1997 |
| JP | A-2007-117586 | 5/2007 |
| JP | A-2007-285745 | 11/2007 |

OTHER PUBLICATIONS

U.S. Appl. No. 12/343,796, filed Dec. 24, 2008., in the name of Fukuzawa et al.

* cited by examiner

*Primary Examiner*—Linh V Nguyen
(74) *Attorney, Agent, or Firm*—Oliff & Berridge, PLC

(57) ABSTRACT

An A/D conversion circuit includes an amplifier circuit that includes a plurality of amplifiers that are cascaded, a selector that selects one of output signals output from the plurality of amplifiers and outputs the selected output signal as a selector output signal, an A/D converter that A/D-converts the selector output signal output from the selector, a determination circuit that determines whether or not a voltage of the output signal output from each of the plurality of amplifiers is within a determination voltage range specified by a high-potential-side determination voltage and a low-potential-side determination voltage, and a control circuit that instructs the selector to select one of the output signals output from the plurality of amplifiers based on the determination result of the determination circuit.

16 Claims, 17 Drawing Sheets

$\frac{1}{GTL} = \frac{1}{G1 \times G2 \times G3}$ IS MULTIPLIED $\frac{1}{GTL} = \frac{1}{G1 \times G2}$ IS MULTIPLIED $\frac{1}{GTL} = \frac{1}{G1}$ IS MULTIPLIED

A/D CONVERSION CIRCUIT AND ELECTRONIC INSTRUMENT

Japanese Patent Application No. 2007-327357 filed on Dec. 19, 2007, is hereby incorporated by reference in its entirety.

BACKGROUND

The present invention relates to an A/D conversion circuit, an electronic instrument, and the like.

In order to implement a ubiquitous network society, a sensor network that is formed by connecting a plurality of sensors through a network and acquires information from each sensor to comprehensively determine the situation is necessary. Such a sensor network utilizes various sensors such as a thermosensor, a smoke sensor, an optical sensor, a human detection sensor, a pressure sensor, a biosensor, and a gyrosensor. A sensor detection signal differs in amplitude, DC offset, frequency band, and the like corresponding to the type of sensor.

Since the sensor detection signal (sensor signal) is an analog signal, it is necessary to convert the analog sensor detection signal into digital data in order to analyze and determine information using a CPU or the like. Therefore, an A/D conversion circuit (analog front-end circuit) that converts an analog detection signal output from a sensor into digital data is used. For example, JP-A-2007-117586 and JP-A-2007-285745 disclose related-art A/D conversion circuits.

An A/D conversion circuit has been generally developed as a sensor-specific IC. Therefore, when a new sensor has been developed, an A/D conversion circuit IC used for the new sensor must be developed and produced by way of trial. This process is very expensive. In this case, a general-purpose A/D conversion circuit IC may be used. However, since a sensor detection signal differs in amplitude and frequency band, it is difficult to deal with a new sensor using a general-purpose A/D conversion circuit IC. Therefore, the user cannot easily produce an IC for various sensors by way of trial.

SUMMARY

According to one aspect of the invention, there is provided an A/D conversion circuit comprising:

an amplifier circuit that includes a plurality of amplifiers and receives an input signal, the plurality of amplifiers being cascaded;

a selector that selects one of output signals output from the plurality of amplifiers and outputs the selected output signal as a selector output signal;

an A/D converter that A/D-converts the selector output signal output from the selector;

a determination circuit that determines whether or not a voltage of the output signal output from each of the plurality of amplifiers is within a determination voltage range specified by a high-potential-side determination voltage and a low-potential-side determination voltage; and a control circuit that instructs the selector to select one of the output signals output from the plurality of amplifiers based on the determination result of the determination circuit.

According to another aspect of the invention, there is provided an electronic instrument comprising the above A/D conversion circuit.

DESCRIPTION OF EXEMPLARY EMBODIMENTS

Figure 1:
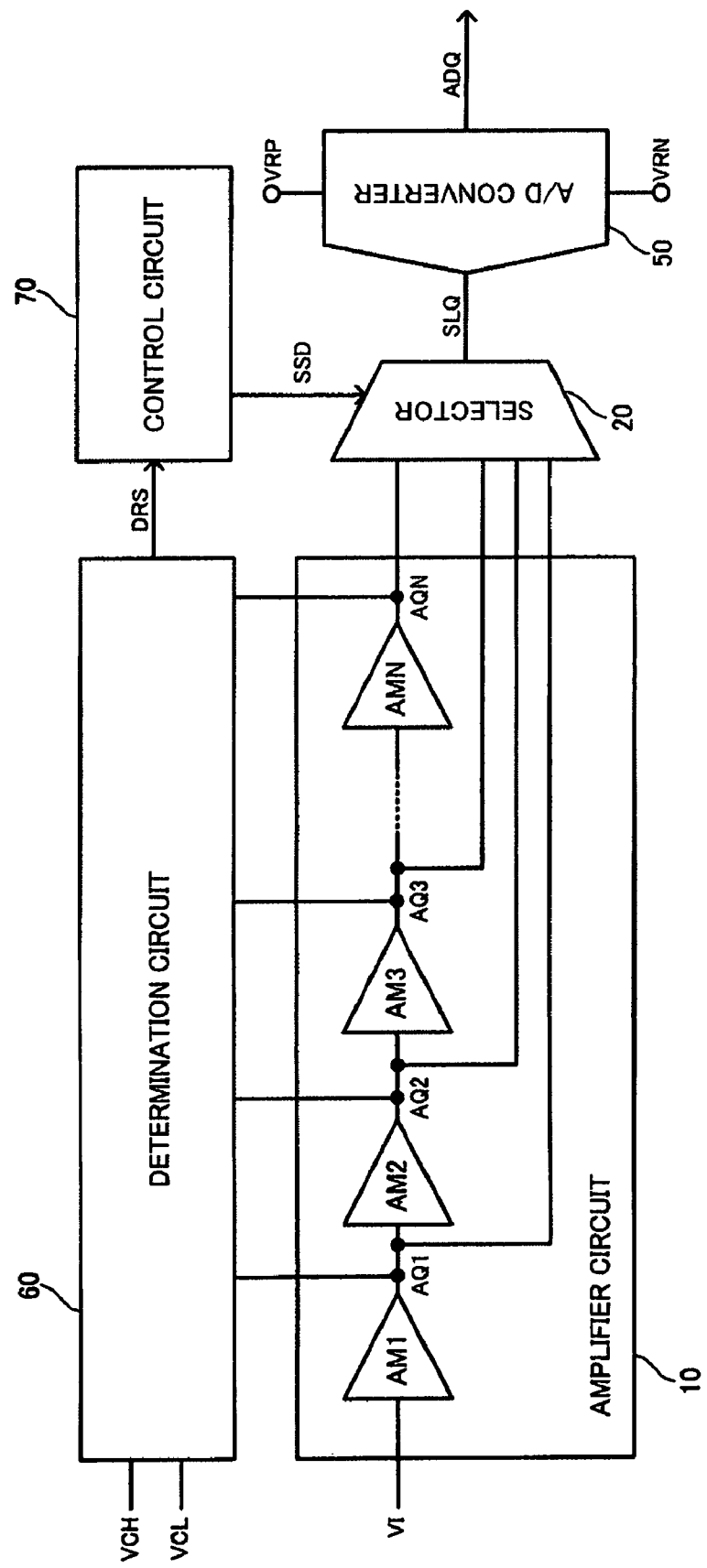
FIG. 1 shows a configuration example of an A/D conversion circuit according to one embodiment of the invention.

Several aspects of the invention may provide an A/D conversion circuit that can A/D-convert an input signal with a wide dynamic range, and an electronic instrument including the A/D conversion circuit.

According to one embodiment of the invention, there is provided an A/D conversion circuit comprising:

an amplifier circuit that includes a plurality of amplifiers and receives an input signal, the plurality of amplifiers being cascaded;

a selector that selects one of output signals output from the plurality of amplifiers and outputs the selected output signal as a selector output signal;

an A/D converter that A/D-converts the selector output signal output from the selector;

a determination circuit that determines whether or not a voltage of the output signal output from each of the plurality of amplifiers is within a determination voltage range specified by a high-potential-side determination voltage and a low-potential-side determination voltage; and a control circuit that instructs the selector to select one of the output signals output from the plurality of amplifiers based on the determination result of the determination circuit.

According to this embodiment, the amplifier circuit includes the cascaded amplifiers, and whether or not the voltage of the output signal output from each amplifier is within the determination voltage range is determined. One of the output signals output from the amplifiers is selected by the selector based on the determination result, and is A/D-converted by the A/D converter. According to this configuration, an output signal of which the voltage is within the determination voltage range can be selected from the output signals output from the amplifiers, and subjected to A/D conversion. Therefore, an A/D conversion circuit that can A/D-convert the input signal with a wide dynamic range can be provided.

In the A/D conversion circuit, the high-potential-side determination voltage may be set at a voltage equal to or lower than a high-potential-side reference voltage that specifies an input voltage range of the A/D converter; and the low-potential-side determination voltage may be set at a voltage equal to or higher than a low-potential-side reference voltage that specifies the input voltage range of the A/D converter.

According to this configuration, since a signal of which the voltage is within the input voltage range of the A/D conversion circuit can be input to the A/D converter through the selector, appropriate A/D conversion can be implemented.

In the A/D conversion circuit, the amplifier circuit may include first to Nth amplifiers as the plurality of amplifiers; and the control circuit may instruct the selector to select an output signal output from a (j−1)th (j is an integer that satisfies $1<j\leq N$) amplifier among the first to Nth amplifiers when the determination circuit has determined that a voltage of an output signal output from a jth amplifier among the first to Nth amplifiers is not within the determination voltage range.

According to this configuration, whether or not to select the output signal output from the (j−1)th amplifier can be determined by determining whether or not the voltage of the output signal output from the jth amplifier is within the determination voltage range.

In the A/D conversion circuit, the amplifier circuit may include first to Nth amplifiers as the plurality of amplifiers; and the control circuit may instruct the selector to select an output signal output from a (j−1)th (j is an integer that satisfies $1<j\leq N$) amplifier among the first to Nth amplifiers when the determination circuit has determined that a voltage of an input signal input to a jth amplifier among the first to Nth amplifiers is not within a Jth determination voltage range that is set corresponding to a gain of the jth amplifier.

According to this configuration, whether or not to select the output signal output from the (j−1)th amplifier can be determined by determining whether or not the voltage of the input signal input to the jth amplifier is within the determination voltage range. Therefore, since the signal delay time of the jth amplifier does not affect the determination time, a quick response can be implemented.

In the A/D conversion circuit, the plurality of amplifiers may include a plurality of amplifiers of which the gains are set at a power of two.

The subsequent digital processing can be simplified by setting the gain at a power of two.

In the A/D conversion circuit, the plurality of amplifiers may include a plurality of inverting amplifiers that are cascaded.

According to this configuration, since it is unnecessary to use a rail-to-rail operational amplifier, a reduction in circuit scale and an improvement in the characteristics of the operational amplifier can be achieved.

In the A/D conversion circuit, each of the plurality of inverting amplifiers may include:

an operational amplifier, an output terminal of the operational amplifier being connected to an output node of the inverting amplifier;

a first resistor provided between a first input terminal of the operational amplifier and an input node of the inverting amplifier; and a second resistor provided between the output node and the first input terminal of the operational amplifier.

In the A/D conversion circuit, the amplifier circuit may include a differential amplifier as a first-stage amplifier of the plurality of amplifiers, the differential amplifier differentially amplifying differential input signals.

According to this configuration, it is possible to deal with a sensor device or the like that outputs differential detection signals.

In the A/D conversion circuit, the determination circuit may include a plurality of comparators, each of the plurality of comparators comparing the voltage of the output signal output from a corresponding amplifier among the plurality of amplifiers with the high-potential-side determination voltage and the low-potential-side determination voltage.

According to this configuration, whether or not the voltage of the output signal is within the determination voltage range can be determined using the comparator.

In the A/D conversion circuit, each of the plurality of comparators may be a comparator that has a hysteresis function.

This prevents a situation in which the output signal output from the comparator is alternately set at a high-voltage level and a low-voltage level so that malfunction of the circuit or the like occurs.

The A/D conversion circuit may further comprise:

a digital processing section that is provided in a subsequent stage of the A/D converter and performs a calculation process based on digital data output from the A/D converter;

the digital processing section may perform a calculation process that differs corresponding to which output signal is selected by the selector from among the output signals output from the plurality of amplifiers.

According to this configuration, an appropriate calculation process corresponding to the selection state of the selector can be performed on the digital data output from the A/D conversion circuit. Therefore, digital data that can be easily handled by a system in the subsequent stage can be output, for example.

In the A/D conversion circuit, the amplifier circuit may include first to Nth amplifiers as the plurality of amplifiers; and the digital processing section may perform a calculation process that multiplies the digital data output from the A/D converter by a multiplication coefficient corresponding to a reciprocal of a total gain of the first amplifier to a (j−1)th (j is an integer that satisfies $1<j\leq N$) amplifier among the first to Nth amplifiers when the selector has selected an output signal output from the (j−1)th amplifier.

This implements a multiplication process that recovers the original voltage level of the signal that has been gain-adjusted by the first to (j−1)th amplifiers.

In the A/D conversion circuit, when the resolution of the A/D converter is n bits (n is an integer equal to or larger than two), the digital processing section may perform the calculation process based on n-bit digital data output from the A/D converter, and may output m-bit (m is an integer larger than n ($m>n$)) digital data.

According to this configuration, digital data that indicates a correct A/D conversion voltage level can be transmitted to the subsequent stage even when performing a gain adjustment or the like using the amplifier.

In the A/D conversion circuit, the plurality of amplifiers may include a plurality of amplifiers of which the gains are set at a power of two; and the digital processing section may shift at least a bit string that is included in the m-bit digital data and indicates an absolute value by a number of bits, the number of bits being determined corresponding to which output signal is selected by the selector from among the output signals output from the plurality of amplifiers.

This implements a bit-shift process that recovers the original voltage level of the signal that has been gain-adjusted by the amplifier.

In the A/D conversion circuit, the plurality of amplifiers may include a plurality of inverting amplifiers that are cascaded; and the digital processing section may set a sign bit of the m-bit digital data corresponding to which output signal is selected by the selector from among the output signals output from the plurality of amplifiers.

According to this configuration, since an appropriate sign bit is set corresponding to an output signal selected by the selector from the output signals output from the amplifiers, consistent digital data with a sign bit can be transmitted to the subsequent stage.

According to another embodiment of the invention, there is provided an electronic instrument comprising one of the above A/D conversion circuits.

Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Configuration of A/D Conversion Circuit

FIG. 1 shows a configuration example of an A/D conversion circuit (A/D conversion device or analog front-end circuit) according to one embodiment of the invention. The A/D conversion circuit includes an amplifier circuit 10, a selector 20, an A/D converter 50, a determination circuit 60, and a control circuit 70. Note that the A/D conversion circuit is not limited to the configuration shown in FIG. 1. Various modifications may be made such as omitting some (e.g., determination circuit and control circuit) of the elements, or adding other elements (e.g., filter, differential amplifier, or amplifier of which the output signal is not connected to the selector).

The amplifier circuit 10 includes a plurality of amplifiers AM1 to AMN (first to Nth amplifiers). The amplifiers AM1 to AMN are cascaded, for example. Specifically, the first amplifier AM1 receives an input signal VI input from a sensor or the like, and outputs a first output signal AQ1. The second amplifier AM2 (jth amplifier in a broad sense; j is an integer that satisfies $1 < j \leq N$) receives the output signal AQ1 ((j−1)th output signal in abroad sense) output from the first amplifier AM1 ((j−1)th amplifier in a broad sense), and outputs a second output signal AQ2 (jth output signal in a broad sense). The Nth amplifier AMN receives an output signal AQN-1 output from the (N−1)th amplifier AMN-1, and outputs an Nth output signal AQN. The amplifiers AM1 to AMN may have a gain adjustment function and an offset adjustment function, for example. When the amplifiers AM1 to AMN have a gain adjustment function, the gains of the amplifiers AM1 to AMN may be set at a power of two. The amplifiers AM1 to AMN (subsequent-stage amplifiers) may include a plurality of inverting amplifiers. Note that a non-inverting amplifier may also be used. The first-stage amplifier AM1 may be a differential amplifier that amplifies differential input signals.

The selector 20 (multiplexer) selects one of the output signals AQ1 to AQN output from the amplifiers AM1 to AMN. The selector 20 outputs the selected output signal as a selector output signal SLQ. Specifically, the selector 20 selects one of the output signals AQ1 to AQN based on a select instruction signal SSD output from the control circuit 70, and outputs the selected output signal. The selector 20 may include a plurality of logic gates, a plurality of transfer transistors, and the like.

The A/D converter 50 A/D-converts the selector output signal SLQ output from the selector 20. Specifically, a high-potential-side reference voltage VRP and a low-potential-side reference voltage VRN that specify (set) an input voltage range are supplied to the A/D converter 50. The A/D converter 50 A/D-converts the selector output signal SLQ at a resolution of n bits (e.g., n=10) in the input voltage range specified by the high-potential-side reference voltage VRP and the low-potential-side reference voltage VRN, and outputs digital data ADQ (digital output value) obtained by A/D conversion. For example, the A/D converter 50 samples/holds the selector output signal SLQ output from the selector 20 using an A/D conversion sampling clock signal, and A/D-converts the sampled/held signal. Note that a prefilter such as an RC filter or a switched capacitor filter (SCF) may be provided in the preceding stage of the A/D converter 50 (i.e., between the A/D converter 50 and the selector 20).

A successive approximation type A/D converter may be used as the A/D converter 50, for example. In this case, the A/D converter 50 may include a sample-hold circuit, a comparator, a successive approximation register, and a D/A converter (not shown). The comparator compares a D/A-converted analog signal output from the D/A converter with a sampled/held signal output from the sample-hold circuit. The successive approximation register stores data relating to an output signal output from the comparator. The D/A converter D/A-converts the digital data output from the successive approximation register, and outputs the resulting analog signal. Note that the A/D converter 50 is not limited to the successive approximation type A/D converter, but may be a parallel comparison type A/D converter, a servo-balancing type A/D converter, or the like.

The determination circuit 60 (comparison circuit) performs a determination process (voltage comparison process) on the output signals AQ1 to AQN output from the amplifiers AM1 to AMN of the amplifier circuit 10. Specifically, the determination circuit 60 determines (compares) whether or not the voltage of the output signal output from each of the amplifiers AM1 to AMN is within a determination voltage range. The determination circuit 60 outputs a determination result signal DRS (e.g., error signal) to the control circuit 70. The determination voltage range is specified by a high-potential-side determination voltage VCH and a low-potential-side determination voltage VCL, for example.

The high-potential-side determination voltage VCH may be set at a voltage equal to or lower than the high-potential-side reference voltage VRP that specifies the input voltage range of the A/D converter 50 (VCH≧VRP), for example. The low-potential-side determination voltage VCL may be set at a voltage equal to or higher than the low-potential-side reference voltage VRN that specifies the input voltage range of the A/D converter 50 (VCL≧VRN). For example, the voltage range specified by the high-potential-side determination voltage VCH and the low-potential-side determination voltage VCL may be narrower than the voltage range specified by the high-potential-side reference voltage VRP and the low-potential-side reference voltage VRN by a margin (e.g., 10 to 90%).

The determination circuit 60 may include a plurality of comparators that compare the voltages of the output signals AQ1 to AQN output from the amplifiers AM1 to AMN with the high-potential-side determination voltage VCH and the low-potential-side determination voltage VCL. In this case, each comparator may be a comparator that has a hysteresis function. Alternatively, a circuit that holds the peak voltage of the output signals AQ1 to AQN may be provided, and the peak voltage may be compared with the determination voltages VCH and VCL using a comparator or the like.

The control circuit 70 controls each circuit included in the A/D conversion circuit, for example. Specifically, the control circuit 70 instructs the selector 20 to select one of the output signals AQ1 to AQN output from the amplifiers AM1 to AMN based on the determination result of the determination circuit 80. For example, the control circuit 70 receives the determination result signal DRS output from the determination circuit 60, generates the select instruction signal SSD, and outputs the select instruction signal SSD to the selector 20. More specifically, when the determination circuit 80 has determined that the voltage of the output signal output from the jth amplifier (e.g., amplifier AM3) among the amplifiers AM1 to AMN is not within the determination voltage range specified by the high-potential-side determination voltage VCH and the low-potential-side determination voltage VCL, the control circuit 70 instructs the selector 20 to select the output signal output from the (j−1)th amplifier (e.g., amplifier AM2) in the preceding stage of the jth amplifier. When the determination circuit 80 has determined that the voltage of the input signal input to the jth amplifier (e.g., amplifier AM3) among the amplifiers AM1 to AMN is not within a determination voltage range (jth determination voltage range) that is set corresponding to the gain of the jth amplifier, the control circuit 70 may instruct the selector 20 to select the output signal output from the (j−1)th amplifier (e.g., amplifier AM2) in the preceding stage of the jth amplifier.

According to this embodiment, when the voltage of the output signal AQ3 output from the amplifier AM3 exceeds the determination voltage range specified by the high-potential-side determination voltage VCH and the low-potential-side determination voltage VCL, for example, the output signal AQ2 output from the amplifier AM2 in the preceding stage of the amplifier AM3 is selected by the selector 20, and is A/D-converted by the A/D converter 50. When the voltage of the output signal AQ2 output from the amplifier AM2 exceeds the determination voltage range specified by the high-potential-side determination voltage VCH and the low-potential-side determination voltage VCL, the output signal AQ1 output from the amplifier AM1 in the preceding stage of the amplifier AM2 is selected by the selector 20, and is A/D-converted by the A/D converter 50. According to this configuration, even if the input signal VI that differs in amplitude and the like is input, a signal within an optimum voltage range is input to the A/D converter 50. Therefore, the dynamic range of the A/D conversion circuit can be increased.

In a related-art A/D conversion circuit, the amplitude and the like of the input signal have been determined to a certain extent corresponding to the specification and the like. Therefore, it suffices that a related-art A/D conversion circuit perform an A/D conversion process within the input voltage range corresponding to the specification.

Figure 2:
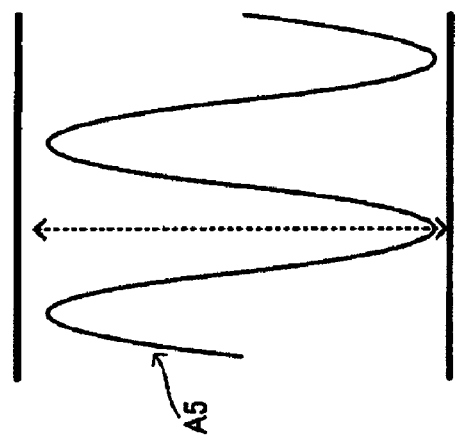
FIG. 2 is a view illustrative of a method that increases the A/D conversion dynamic range.
Figure 2:
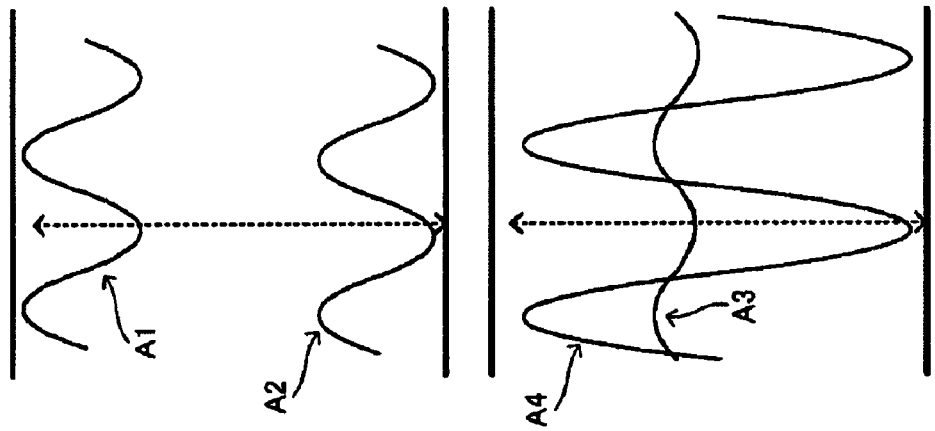
Figure 3:
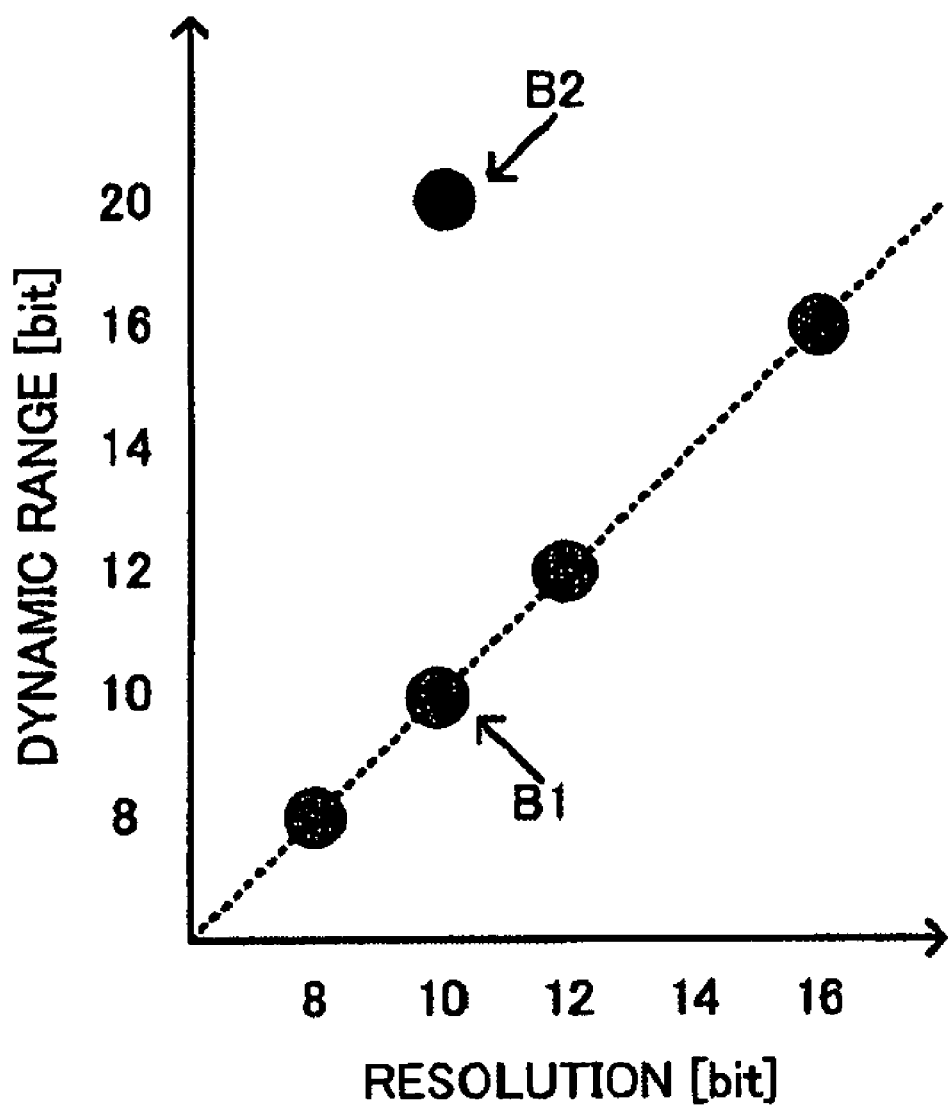
FIG. 3 is a view showing the relationship between the dynamic range and the resolution.

However, when subjecting a detection signal output from a sensor (sensor device) or the like to A/D conversion, the DC offset of the input signal VI (detection signal) differs corresponding to the type of sensor, as indicated by A1 and A2 in FIG. 2. The amplitude of the input signal VI also differs corresponding to the type of sensor, as indicated by A3 and A4. Therefore, when performing an A/D conversion process using a related-art A/D conversion circuit, the dynamic range cannot be increased without increasing the A/D conversion resolution, as indicated by B1 in FIG. 3. Specifically, the number of bits of the A/D conversion resolution is increased so that a change in the amplitude and the like of the input signal can be absorbed. An increase in the number of bits of the A/D conversion resolution results in an increase in circuit scale, power consumption, and the like. Moreover, the design becomes complicated.

According to this embodiment, an output signal within a voltage range close to the input voltage range (VRP to VRN) of the A/D converter 50 is selected by the selector 20, and is input to and A/D-converted by the A/D converter 50. Therefore, even if the amplitude of the input signal VI has changed (A3 and A4 in FIG. 2), the A/D input amplitude (swing level) (i.e., the amplitude of the input signal input to the A/D converter 50) can be made almost constant. Therefore, the dynamic range can be significantly increased.

For example, when the A/D input amplitude (maximum input amplitude) of the A/D converter 50 is referred to as VAT, and the voltage corresponding to the 1LSB of the A/D converter 50 is referred to as VLSB, the dynamic range DR can be expressed by DR=VAT/VLSB. According to the related-art technology, when the amplitude of the input signal VI is small (see A3 in FIG. 2), the A/D input amplitude VAT also decreases. Therefore, in order to increase the dynamic range DR (=VAT/VLSB), it is necessary to increase the number of bits of the A/D conversion resolution to reduce the voltage VLSB (see B1 in FIG. 3). As a result, an increase in the dynamic range DR is limited.

According to this embodiment, the A/D input amplitude increases (see A5 in FIG. 2) even if the amplitude of the input signal VI is small (see A3 in FIG. 2). Therefore, the dynamic range DR can be increased without changing the A/D conversion resolution (e.g., 10 bits) (see B2 in FIG. 3).

In the development/trial production stage of a new sensor, for example, the amplitude and the like of a detection signal output from the sensor may be unknown. According to this embodiment, an output signal having an appropriate amplitude is automatically selected from the output signals AQ1 to AQN output from the amplifiers AM1 to AMN, and is input to the A/D converter 50. Therefore, the user can connect the sensor to the A/D conversion circuit without taking the amplitude and the like of the detection signal into consideration. Therefore, a user-friendly A/D conversion circuit can be provided. Moreover, since it is unnecessary to produce a new IC by way of trial corresponding to the type of sensor, the development cost can be reduced.

As a comparative example of this embodiment, the output signals AQ1 to AQN output from the amplifiers AM1 to AMN may be monitored, and the gains of the amplifiers AM1 to AMN may be automatically adjusted based on the monitoring results.

According to the method of the comparative example, a time lag occurs due to the automatic adjustment. Therefore, the method of the comparative example is not suitable for a signal that requires a quick automatic adjustment (e.g., an AC signal such as sound), a detection signal that can be sampled only once (e.g., hard disk drive fall detection), and a signal of which the amplitude and the like must be detected immediately for a quick response.

In the real-time automatic adjustment method according to this embodiment, since an automatic adjustment time lag occurs due to only the determination period of the determination circuit 60 and the select period of the selector 20, it is possible to quickly deal with a change in signal and the like and make a real-time automatic adjustment. Therefore, a dynamic range automatic adjustment method that is optimum for a signal that requires a quick automatic adjustment, a detection signal that can be sampled only once, and the like can be provided.

2. First Configuration Example

Figure 4:
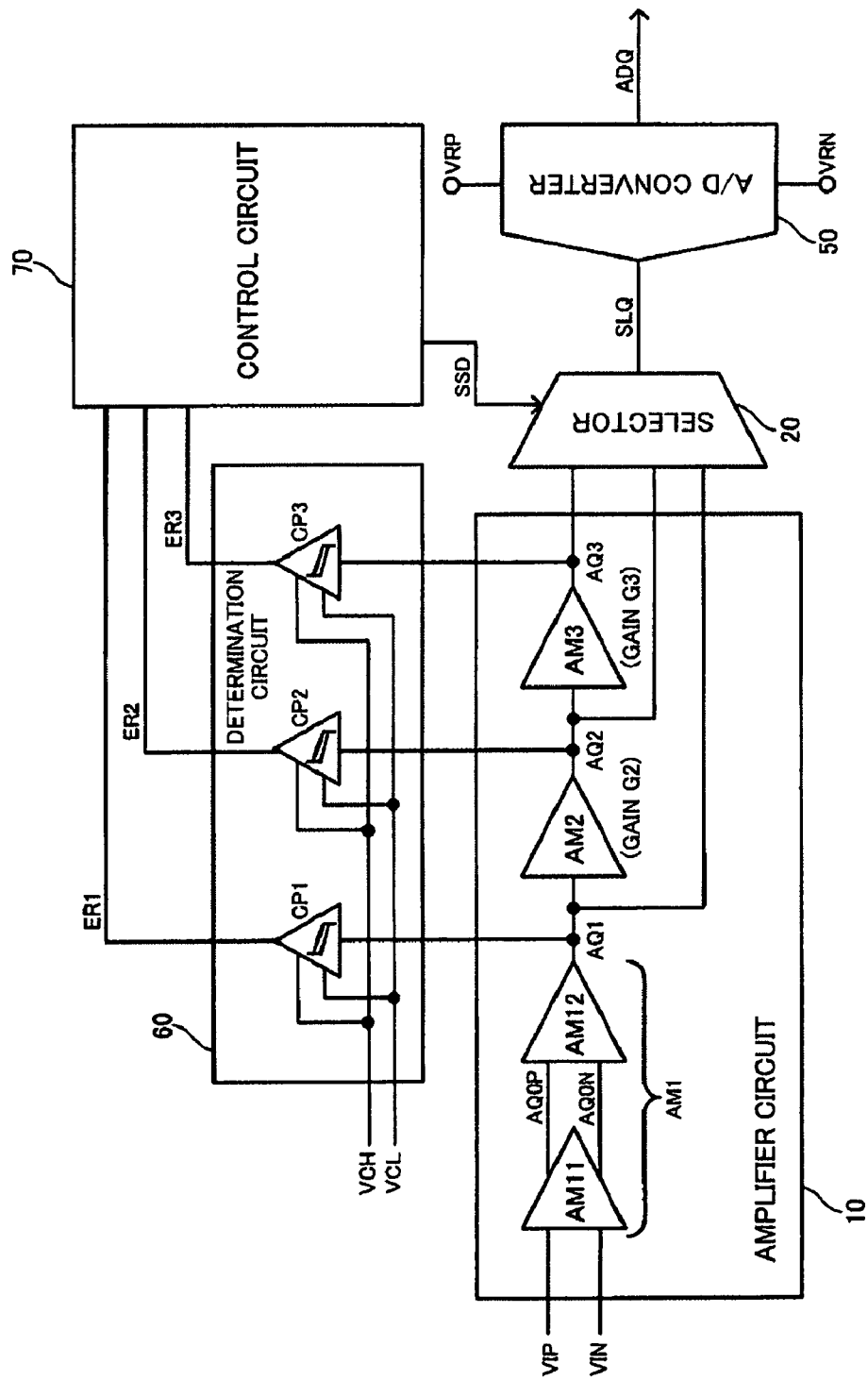
FIG. 4 shows a detailed first configuration example of an A/D conversion circuit according to one embodiment of the invention.

FIG. 4 shows a first configuration example of the A/D conversion circuit according to this embodiment. The first configuration example is a detailed configuration example of the amplifier circuit 10 and the determination circuit 60.

The amplifier circuit 10 includes the amplifiers AM1, AM2, and AM3. The differential amplifier AM1 includes amplifiers AM11 and AM12. Note that the number of stages of the amplifiers is arbitrary. The number of stages of the amplifiers may be three (four) or more.

The amplifier AM11 is a differential-input/differential-output amplifier. The amplifier AM11 differentially amplifies differential input signals VIP and VIN. The amplifier AM12 is a differential-input/single-ended-output amplifier. The amplifier AM12 receives differential output signals AQ0P and AQ0N output from the amplifier AM11, and outputs a single-ended signal AQ1. The first-stage amplifier AM1 (differential amplifier) is formed by the amplifiers AM11 and AM12. The subsequent-stage amplifiers AM2 and AM3 are single-ended-input/single-ended-output amplifiers. The amplifier AM2 and AM3 respectively output signals AQ2 and AQ3. The gains G2 and G3 of the amplifiers AM2 and AM3 can be variably adjusted. Specifically, the gains G2 and G3 of the amplifiers AM2 and AM3 are set at a power of two (e.g., $2^0, 2^1, 2^2, 2^3, \ldots$).

The determination circuit 60 includes a plurality of comparators (comparison circuits) CP1, CP2, and CP3. The comparators CP1, CP2, and CP3 respectively compare the output signals AQ1, AQ2, and AQ3 output from the amplifiers AM1 (AM11 and AM12), AM2, and AM3 with the high-potential-side determination voltage VCH and the low-potential-side determination voltage VCL. The comparators CP1, CP2, and CP3 determine whether or not the voltages of the output signals AQ1, AQ2, and AQ3 are within the determination voltage range specified by the high-potential-side determination voltage VCH and the low-potential-side determination voltage VCL. When the comparators CP1, CP2, and CP3 have determined that the voltages of the output signals AQ1, AQ2, and AQ3 are not within the determination voltage range, the comparators CP1, CP2, and CP3 respectively activate error signals ER1, ER2, and ER3 (signal DRS) that indicate the determination result. For example, when the voltages of the output signals AQ1, AQ2, and AQ3 are outside the determination voltage range, the comparators CP1, CP2, and CP3 respectively activate the signals ER1, ER2, and ER3. Each of the comparators CP1 to CP3 may include a first comparator that compares the voltage of the output signal with the determination voltage VCH, and a second comparator that compares the voltage of the output signal with the determination voltage VCL.

It is desirable that each of the comparators CP1 to CP3 have a hysteresis function. For example, when the voltage (peak voltage) of one of the signals AQ1 to AQ3 is close to the determination voltage VCH or VCL, a situation in which the signals ER1, ER2, and ER3 are alternately set at the H level and the L level occurs. This causes malfunction of the circuit. Such a situation can be prevented by providing the comparators CP1 to CP3 with a hysteresis function (hysteresis characteristics using two threshold voltages). Note that a peak-hold circuit that holds the peak voltage of the output signals AQ1 to AQ3 may be provided instead of a hysteresis type comparator.

Figure 5:
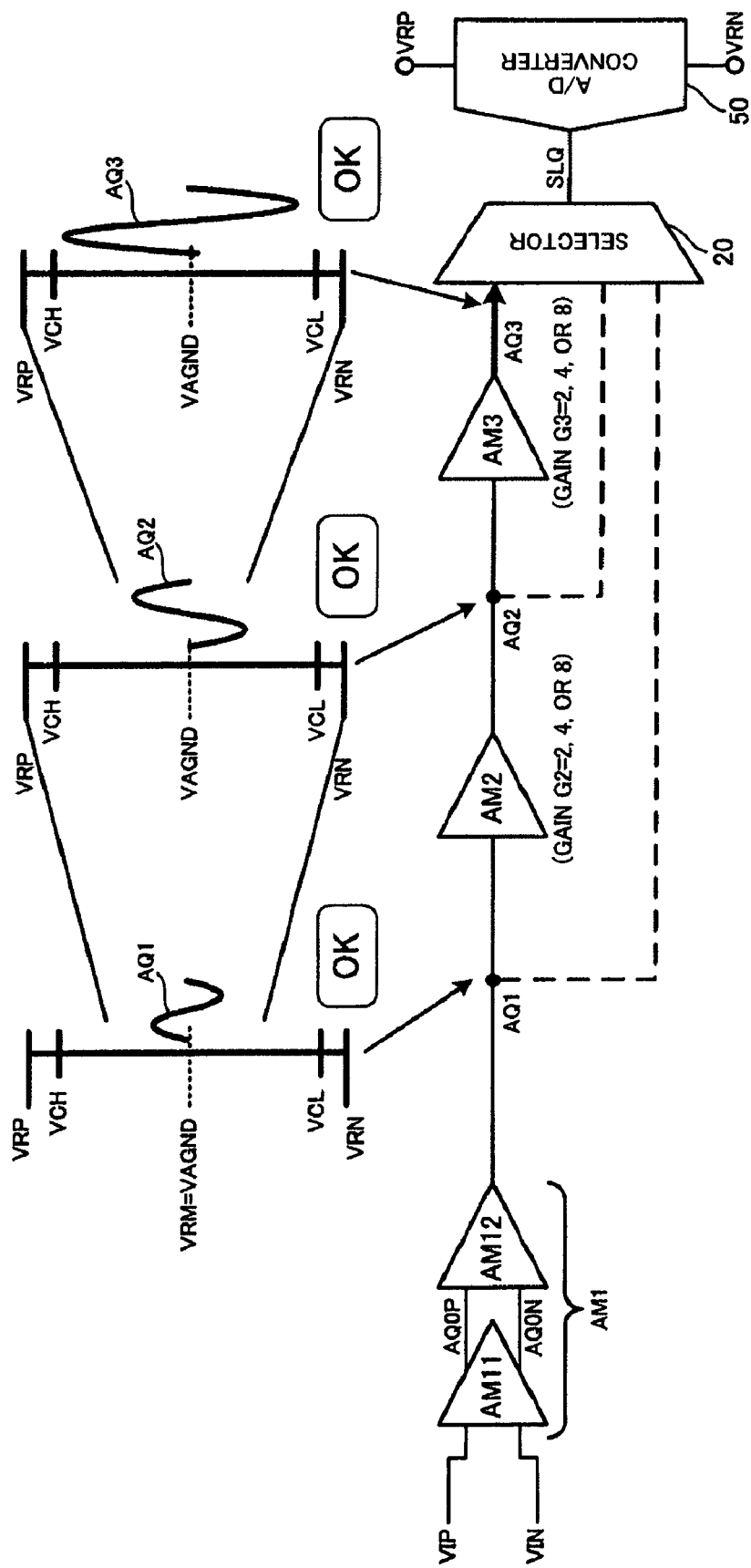
FIG. 5 is a view illustrative of the operation according to a first configuration example.

The operation according to the first configuration example is described below with reference to FIGS. 5 to 8. In FIG. 5, the voltage of the output signal AQ1 output from the amplifier AM1 is within the determination voltage range specified by the high-potential-side determination voltage VCH and the low-potential-side determination voltage VCL. Therefore, the error signal ER1 output from the comparator CP1 shown in FIG. 4 is set at the L level (inactive). In FIG. 5, the voltages of the output signals AQ2 and AQ3 output from the amplifiers AM2 and AM3 are within the determination voltage range specified by the high-potential-side determination voltage VCH and the low-potential-side determination voltage VCL. Therefore, the error signals ER2 and ER3 output from the comparators CP2 and CP3 are also set at the L level (inactive).

As shown in FIG. 5, the high-potential-side determination voltage VCH is equal to or lower than the high-potential-side reference voltage VRP of the A/D converter 50, and the low-potential-side determination voltage VCL is equal to or higher than the low-potential-side reference voltage VRN. The voltage of the selector output signal SLQ can be set within the voltage range specified by the high-potential-side reference voltage VRP and the low-potential-side reference voltage VRN of the A/D converter 50 by setting the high-potential-side determination voltage VCH to be equal to or lower than the high-potential-side reference voltage VRP (VCH<VRP) and setting the low-potential-side determination voltage VCL to be equal to or higher than the low-potential-side reference voltage VRN (VCL≧VRN). A margin of the detection range can be provided by setting the high-potential-side determination voltage VCH to be lower than the high-potential-side reference voltage VRP (VCH<VRP) and setting the low-potential-side determination voltage VCL to be higher than the low-potential-side reference voltage VRN (VCL>VRN).

In FIG. 5, since the signals ER1, ER2, and ER3 are set at the L level, the control circuit 70 that has received the signals ER1, ER2, and ER3 outputs the signal SSD that instructs the selector 20 to select the output signal AQ3 output from the amplifier AM3 to the selector 20. The selector 20 then selects the signal AQ3. The signal AQ3 is input to the A/D converter 50 as the selector output signal SLQ, and subjected to A/D conversion. The amplitude of the signal AQ3 is larger than those of the signals AQ2 and AQ1. Specifically, the high-potential-side peak voltage and the low-potential-side peak voltage of the signal AQ3 are close to the reference voltages VRP and VRN of the A/D converter 50. Therefore, the input amplitude VAT of the A/D converter 50 can be increased so that the dynamic range DR (=VAT/VLSB) can be increased.

Figure 6:
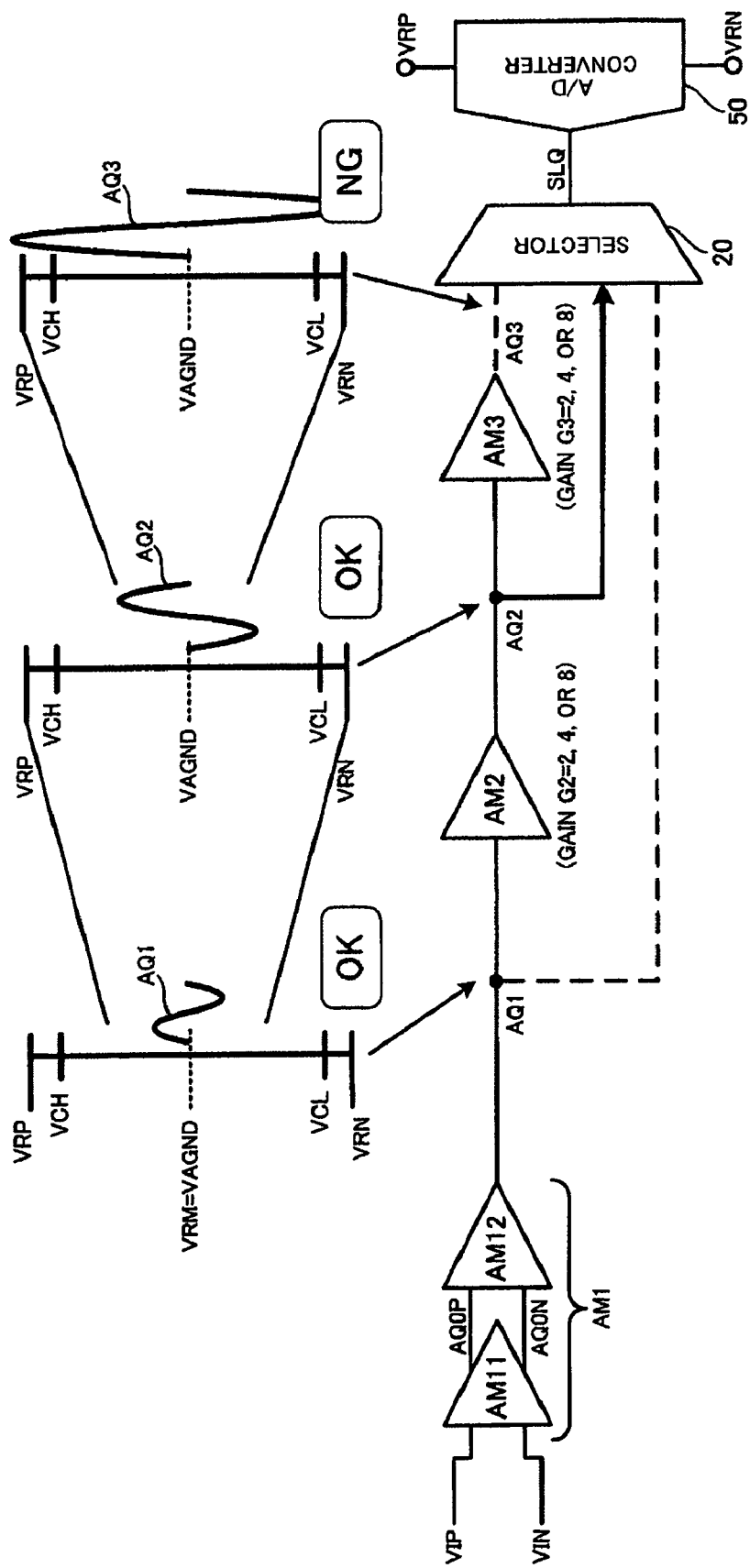
FIG. 6 is a view illustrative of the operation according to a first configuration example.

In FIG. 6, the voltages of the output signals AQ1 and AQ2 output from the amplifiers AM1 and AM2 are within the determination voltage range specified by the high-potential-side determination voltage VCH and the low-potential-side determination voltage VCL. On the other hand, the voltage of the output signal AQ3 output from the amplifier AM3 is outside the determination voltage range specified by the high-potential-side determination voltage VCH and the low-potential-side determination voltage VCL. In this case, the error signals ER1, ER2, and ER3 output from the comparators CP1, CP2, and CP3 are set at the L level, L level, and H level, respectively, so that saturation of the amplifier AM3 is detected. The control circuit 70 that has received the signals ER1, ER2, and ER3 outputs the signal SSD that instructs the selector 20 to select the output signal AQ2 output from the amplifier AM2 to the selector 20. The selector 20 then selects the signal AQ2. The signal AQ2 is input to the A/D converter 50, and subjected to A/D conversion. The amplitude of the signal AQ2 is larger than that of the signal AQ1. Therefore, the input amplitude of the A/D converter 50 can be increased so that the dynamic range can be increased. Moreover, a situation in which the output signal AQ3 output from the amplifier AM3 of which the output has been saturated is input to the A/D converter 50 and erroneously subjected to A/D conversion can be prevented.

Figure 7:
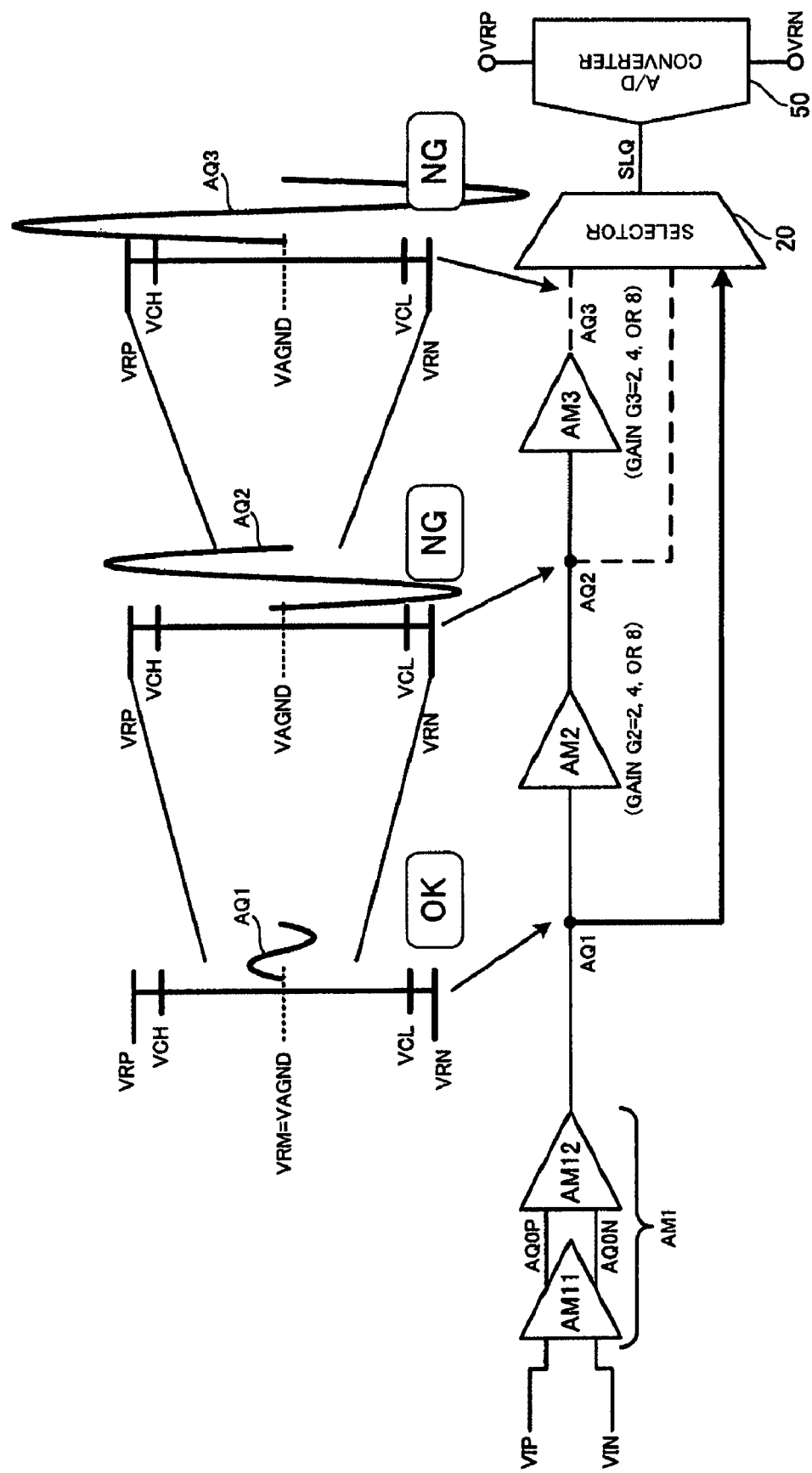
FIG. 7 is a view illustrative of the operation according to a first configuration example.

In FIG. 7, the voltage of the output signal AQ1 output from the amplifier AM1 is within the determination voltage range, and the voltages of the output signals AQ2 and AQ3 output from the amplifiers AM2 and AM3 are outside the determination voltage range. In this case, the error signals ER1, ER2, and ER3 are set at the L level, H level, and H level, respectively, so that saturation of the amplifiers AM2 and AM3 is detected. Therefore, the selector 20 selects the signal AQ1, and the signal AQ1 is subjected to A/D conversion. This prevents a situation in which the output signal AQ2 or AQ3 output from the amplifier AM2 or AM3 of which the output has been saturated is input to the A/D converter 50 and erroneously subjected to A/D conversion.

Figure 8:
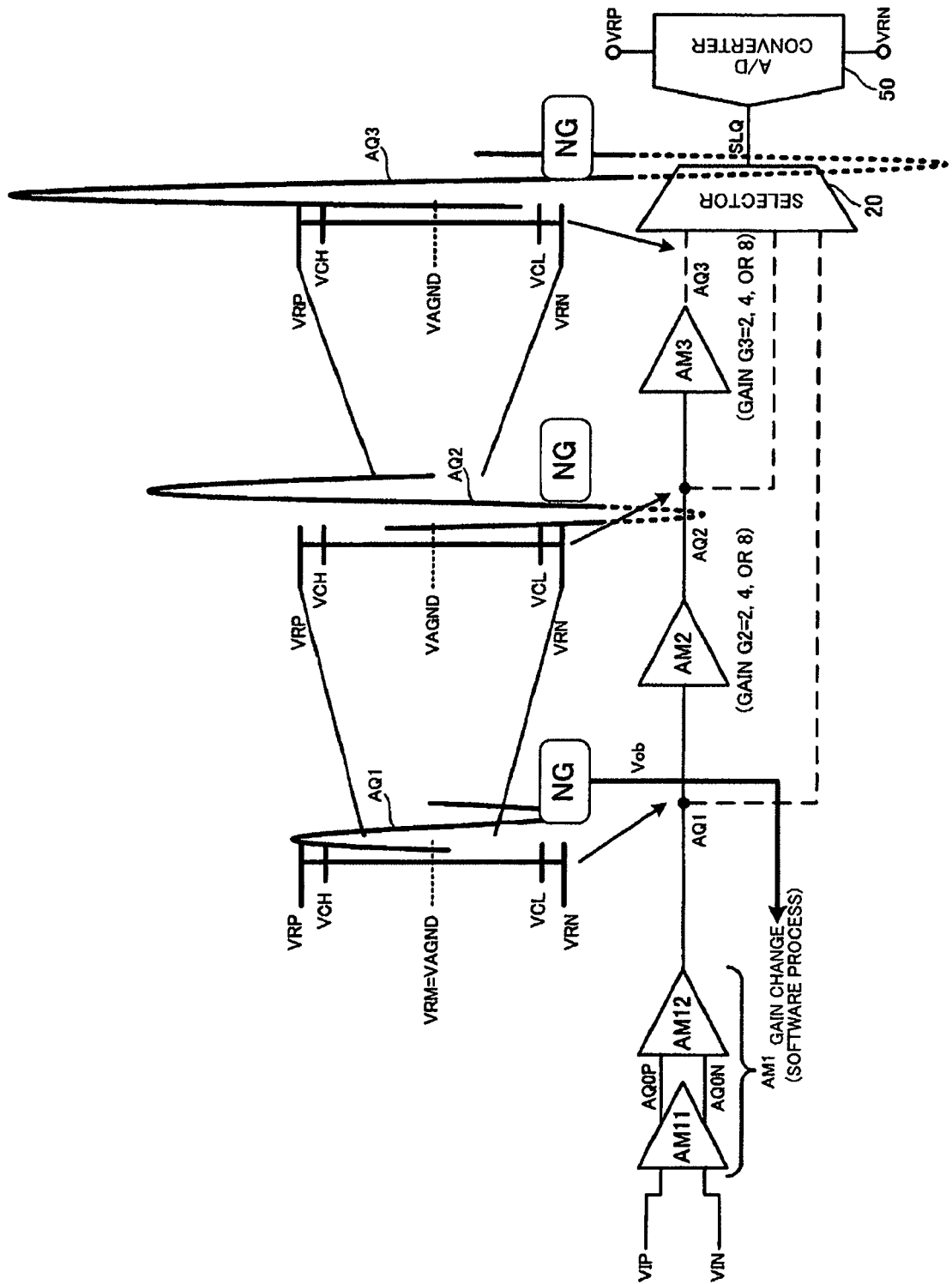
FIG. 8 is a view illustrative of the operation according to a first configuration example.

In FIG. 8, the voltages of the output signals AQ1, AQ2, and AQ3 output from the amplifiers AM1, AM2, and AM3 are outside the determination voltage range. In this case, the error signals ER1, ER2, and ER3 are set at the H level so that saturation of the amplifiers AM1, AM2, and AM3 is detected. This prevents a situation in which the output signal AQ1, AQ2, or AQ3 output from the amplifier AM1, AM2, or AM3 of which the output has been saturated is input to the A/D converter 50 and erroneously subjected to A/D conversion.

When the situation shown in FIG. 8 has occurred, the gain of the amplifier AM1 (AM11 and AM12) may be changed by a software process or the like so that the voltage of the signal AQ1 falls within the determination voltage range. In this case, since a time lag occurs due to the gain adjustment, the response is delayed. However, appropriate A/D conversion using the A/D converter 50 can be implemented.

3. Second Configuration Example

Figure 9:
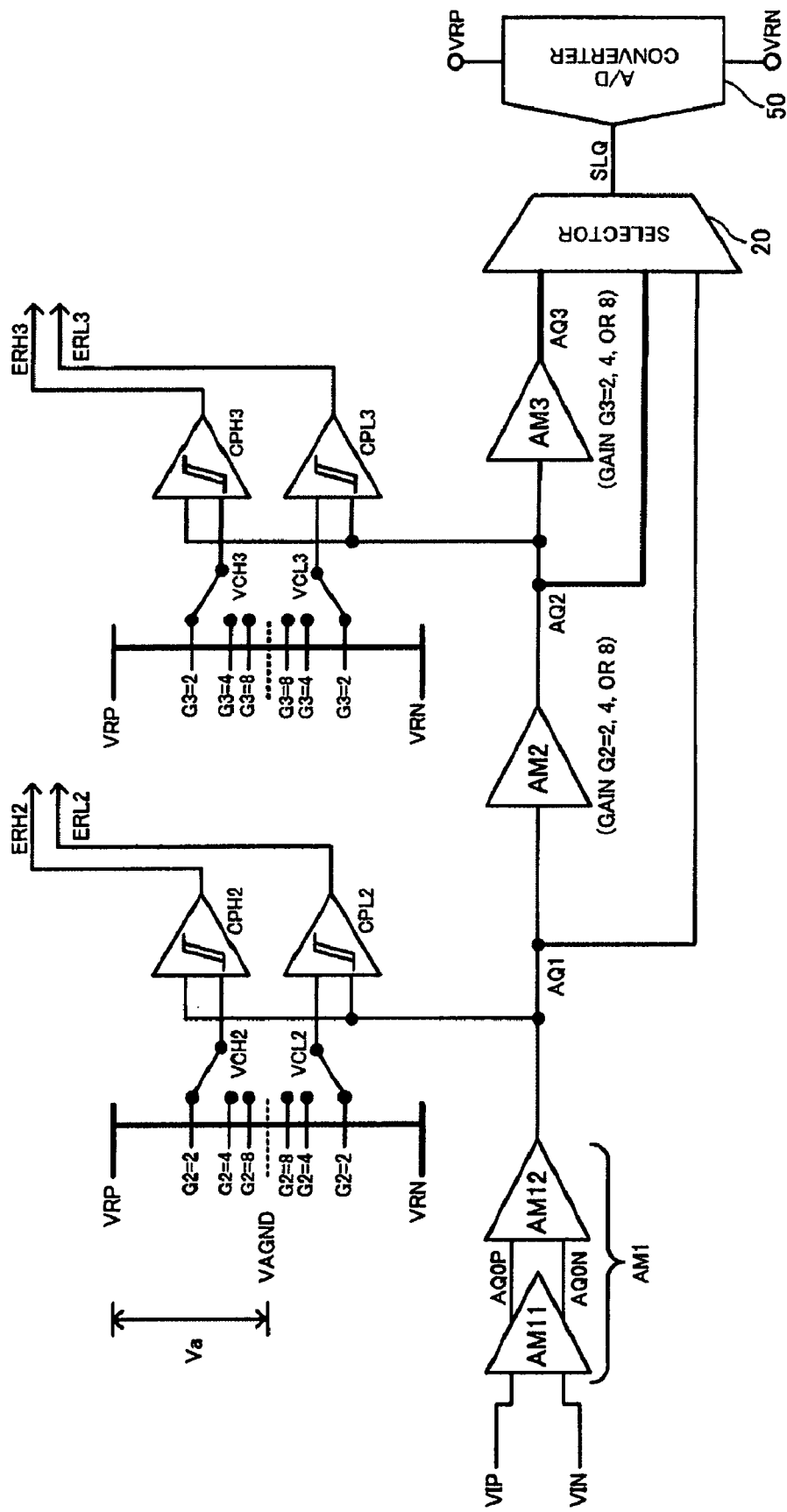
FIG. 9 shows a detailed second configuration example of an A/D conversion circuit according to one embodiment of the invention.

FIG. 9 shows a second configuration example of the A/D conversion circuit according to this embodiment. In the first configuration example shown in FIG. 4, whether or not the voltage of the output signal output from each amplifier is within the determination voltage range is determined. In the second configuration example shown in FIG. 9, whether or not the voltage of the input signal input to each amplifier is within a determination voltage range corresponding to the gain of each amplifier is determined. For example, when the voltage of the input signal AQ1 input to the amplifier AM2 (jth amplifier) has been determined to be outside the determination voltage range set corresponding to the gain G2 of the amplifier AM2, the control circuit 70 instructs the selector 20 to select the output signal AQ1 output from the amplifier AM1 in the preceding stage of the amplifier AM2.

In FIG. 9, a comparator CPH2 compares the voltage of the input signal AQ1 input to the amplifier AM2 with a high-potential-side determination voltage VCH2. A comparator CPL2 compares the voltage of the input signal AQ1 input to the amplifier AM2 with a low-potential-side determination voltage VCL2.

The determination voltages VCH2 and VCL2 are set corresponding to the gain G2 of the amplifier AM2. For example, the high-potential-side determination voltage VCH2 decreases as the gain G2 of the amplifier AM2 increases, and the low-potential-side determination voltage VCL2 increases as the gain G2 increases. In other words, the determination voltage range specified by the high-potential-side determination voltage VCH2 and the low-potential-side determination voltage VCL2 becomes narrow as the gain G2 of the amplifier AM2 increases. The comparator CPH2 activates an error signal ERH2 when the voltage of the signal AQ1 has exceeded the determination voltage VCH2. The comparator CPL2 activates an error signal ERL2 when the voltage of the signal AQ1 has become lower than the determination voltage VCL2.

Likewise, comparators CPH3 and CPL3 compare the voltage of the input signal AQ2 input to the amplifier AM3 with determination voltages VCH3 and VCL3. The determination voltage range specified by the determination voltages VCH3 and VCL3 becomes narrow as the gain G3 of the amplifier AM3 increases. The comparator CPH3 activates an error signal ERH3 when the voltage of the signal AQ2 has exceeded the determination voltage VCH3. The comparator CPL3 activates an error signal ERL3 when the voltage of the signal AQ2 has become lower than the determination voltage VCL3.

Figure 10:
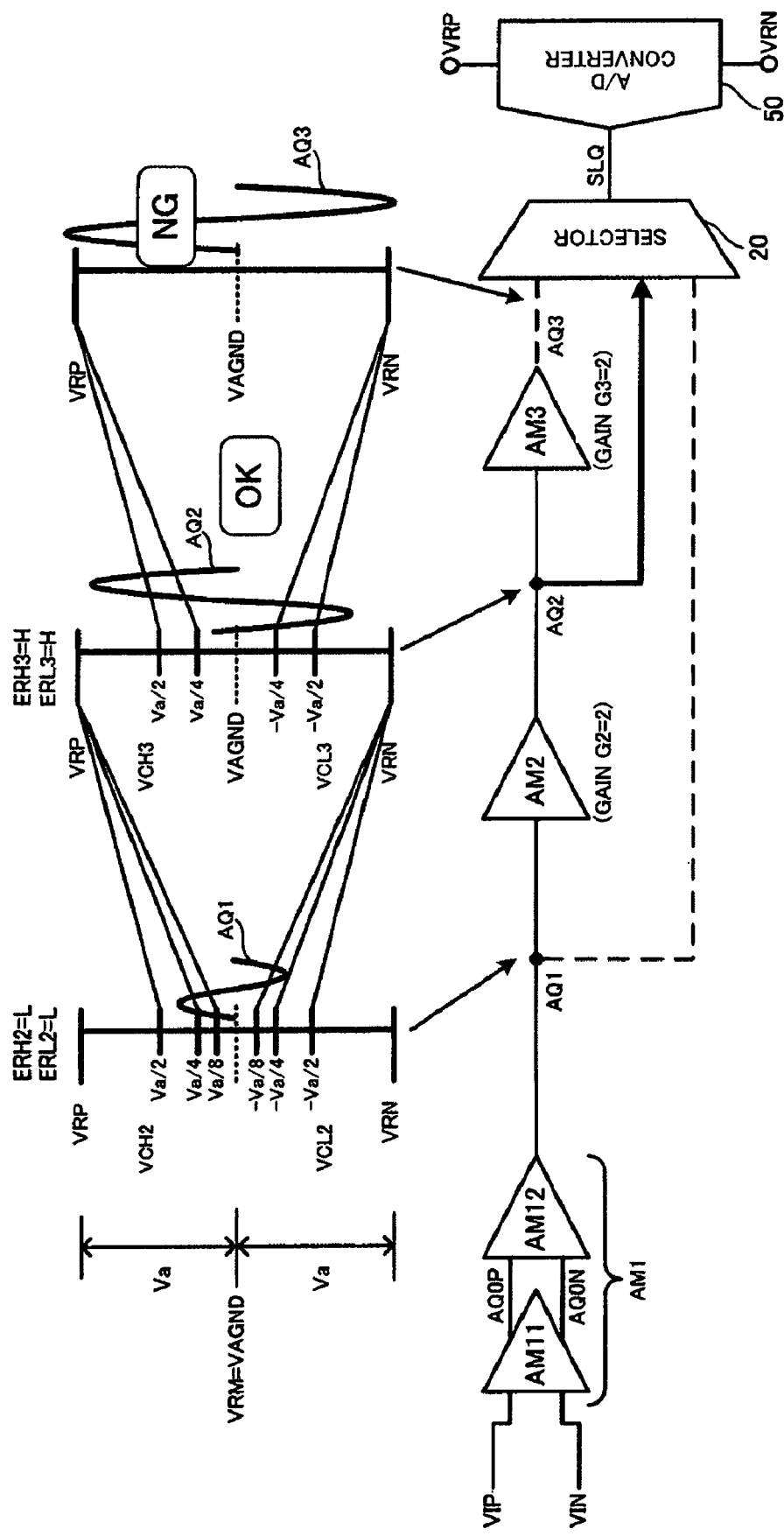
FIG. 10 is a view illustrative of the operation according to a second configuration example.

The operation according to the second configuration example is described below with reference to FIG. 10. In FIG. 10, the gains G2 and G3 of the amplifiers AM2 and AM3 are set at two (G2=G3=2). Therefore, when the reference voltage VRP is Va and the reference voltage VRN is −Va, the determination voltage VCH2 is Va/G2=Va/2, the determination voltage VCL2 is −Va/G2=−Va/2, the determination voltage VCH3 is Va/G3=Va/2, and the determination voltage VCL3 is −Va/G3=−Va/2.

In FIG. 10, the voltage of the input signal AQ1 input to the amplifier AM2 is within the determination voltage range specified by the voltages −Va/2 and Va/2 corresponding to the gain G2 of the amplifier AM2. Therefore, the error signals ERH2 and ERL2 are set at the L level (inactive). On the other hand, the voltage of the input signal AQ2 input to the amplifier AM3 is outside the determination voltage range specified by the voltages −Va/2 and Va/2 corresponding to the gain G3 of the amplifier AM3. Therefore, the error signals ERH3 and ERL3 are set at the H level (active). Specifically, the voltage of the signal obtained by amplifying the signal AQ2 using the amplifier AM3 with the gain G3 is outside the voltage range specified by the reference voltages VRP and VRN. In this case, the signal AQ2 is selected by the selector 20, input to the A/D converter 50 as the signal SLQ, and subjected to A/D conversion. This prevents a situation in which the output signal AQ3 output from the amplifier AM3 of which the output has been saturated is input to the A/D converter 50 and erroneously subjected to A/D conversion.

For example, when saturation of the amplifier AM3 is determined based on the output signal AQ3 output from the amplifier AM3 as in the first configuration example shown in FIG. 4, a time lag occurs due to the signal delay time of the amplifier AM3 so that the determination time is delayed (increases).

In the second configuration example shown in FIG. 9, saturation of the amplifier AM3 is determined based on the input signal AQ2 input to the amplifier AM3. Therefore, since the signal delay time of the amplifier AM3 does not affect the determination time, a quick response can be achieved as compared with the first configuration example. As a result, an A/D conversion circuit suitable for a signal that requires a quick automatic adjustment (e.g., an AC signal such as sound), a signal that can be sampled only once, and the like can be provided.

4. Circuit Configuration of Amplifier

Figure 11:
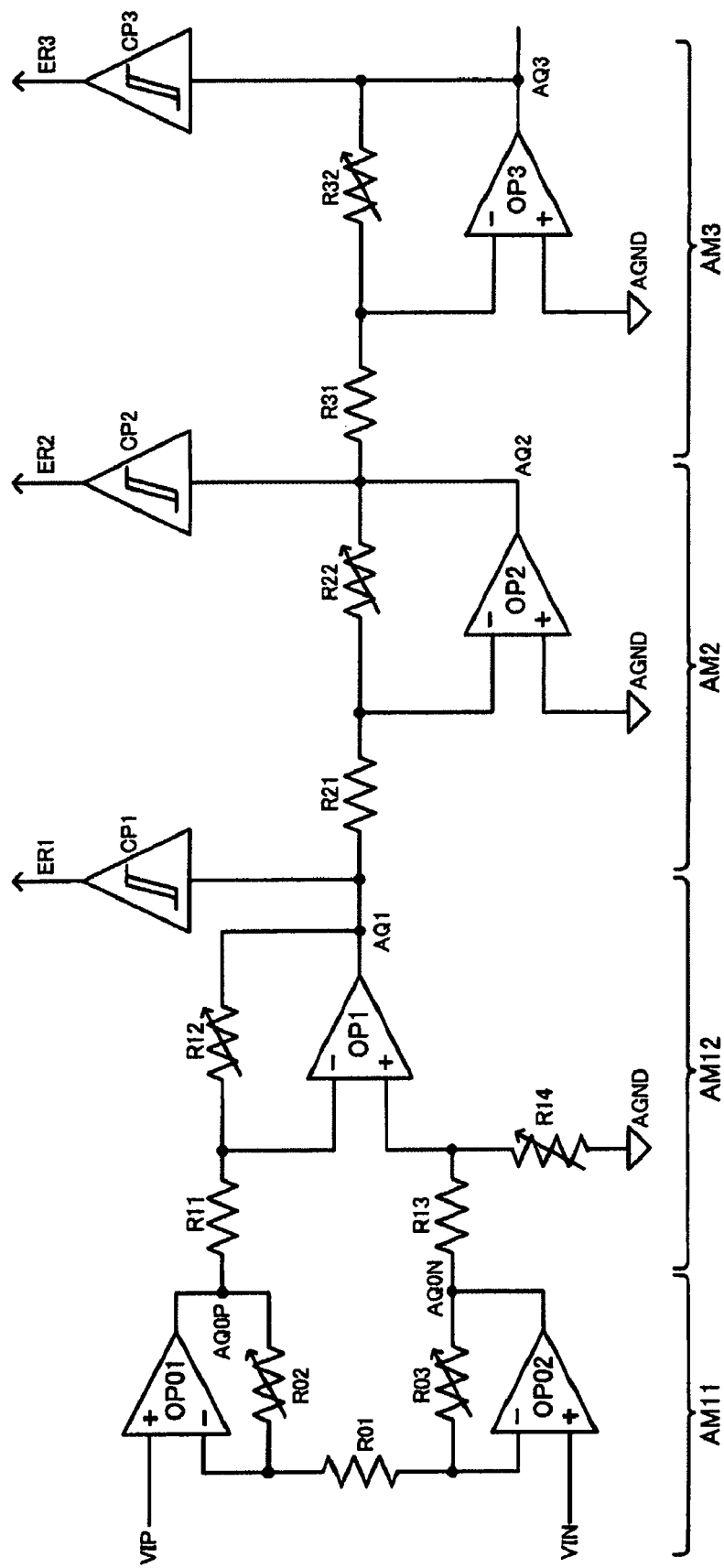
FIG. 11 shows a specific circuit configuration example of each amplifier.

FIG. 11 shows a specific circuit configuration example of the amplifiers AM11, AM12, AM2, and AM3 according to the first and second configuration examples shown in FIGS. 4 and 9.

The amplifier AM11 includes operational amplifiers OP01 and OP02 and resistors R01, R02, and R03. The resistors R02 and R03 are variable resistors, for example. The amplifier AM12 includes operational amplifiers OP1 and resistors R11, R12, R13, and R14. The resistors R12 and R14 are variable resistors, for example. The amplifiers AM11 and AM12 form an instrumentation amplifier that utilizes the operational amplifiers OP01, OP02, and OP1. The instrumentation amplifier is a differential-input/single-ended output balanced-input amplifier. The instrumentation amplifier is characterized in that the common mode rejection ratio (CMRR) can be increased. A sensor that outputs differential detection signals and a sensor that outputs a single-ended detection signal can be connected to the first-stage differential amplifier by utilizing the instrumentation amplifier as the first-stage differential amplifier. For example, when connecting a sensor that outputs differential detection signals to the first-stage differential amplifier, a first signal (positive) that forms the differential detection signals is input as the signal VIP, and a second signal (negative) that forms the differential detection signals is input as the signal VIN. When connecting a sensor that outputs a single-ended detection signal to the first-stage differential amplifier, the single-ended detection signal is input as the signal VIP, and a VIN terminal is set at a reference analog voltage AGND, for example.

The amplifier AM2 includes an operational amplifier OP2 and resistors R21 and R22. The resistor R22 is a variable resistor, for example. The gain G2 of the amplifier AM2 is adjusted using the resistor R22. The amplifier AM3 includes an operational amplifier OP3 and resistors R31 and R32. The resistor R32 is a variable resistor, for example. The gain G3 of the amplifier AM3 is adjusted using the resistor R32. The amplifiers AM2 and AM3 are inverting amplifiers.

Specifically, the output terminal of the operational amplifier OP2 is connected to the output node of the inverting amplifier AM2. The first resistor R21 is provided between the inverting input terminal (first input terminal in a broad sense) of the operational amplifier OP2 and the input node of the inverting amplifier AM2. The second resistor R22 is provided between the output node of the inverting amplifier AM2 and the inverting input terminal of the operational amplifier OP2. The non-inverting input terminal (second input terminal in a broad sense) of the operational amplifier OP2 is set at the reference analog voltage AGND, for example. The configuration of the inverting amplifier AM3 is the same as the configuration of the inverting amplifier AM2.

It is unnecessary to use rail-to-rail operational amplifiers as the operational amplifiers OP2 and OP3 of the amplifiers AM2 and AM3 by utilizing the inverting amplifiers as the amplifiers AM2 and AM3. For example, when utilizing non-inverting amplifiers as the amplifiers AM2 and AM3, a signal having a large amplitude is distorted. It is necessary to use a rail-to-rail operational amplifier in order to prevent such a problem. However, a rail-to-rail operational amplifier has a disadvantage in that the circuit scale of the operational amplifier increases and it is difficult to improve the characteristics of the operational amplifier. The above-mentioned problems can be solved by utilizing the inverting amplifiers as the amplifiers AM2 and AM3.

Figure 12:
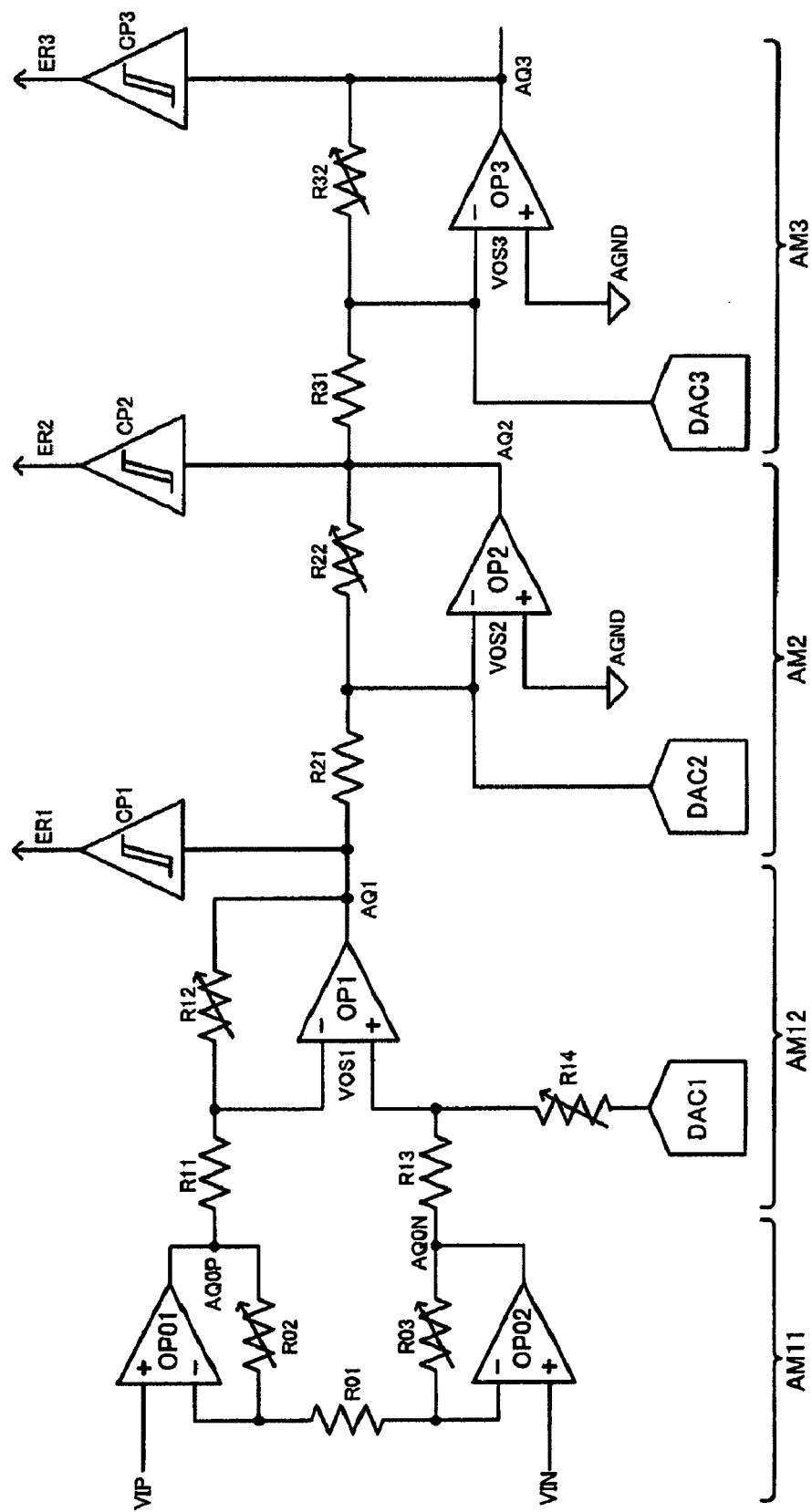
FIG. 12 shows another specific circuit configuration example of each amplifier.

FIG. 12 shows another configuration example of the amplifiers AM11, AM12, AM2, and AM3. In FIG. 12, D/A converters DAC1, DAC2, and DAC3 are provided in addition to the configuration shown in FIG. 11. The offset of the A/D conversion circuit can be adjusted by utilizing the D/A converters DAC1, DAC2, and DAC3. Specifically, an offset adjustment that cancels offset voltages VOS1, VOS2, and VOS3 of the operational amplifiers OP1, OP2, and OP3 or an offset adjustment that adjusts the DC offset of the input signal to increase the A/D conversion dynamic range can be implemented.

5. Third Configuration Example

Figure 13:
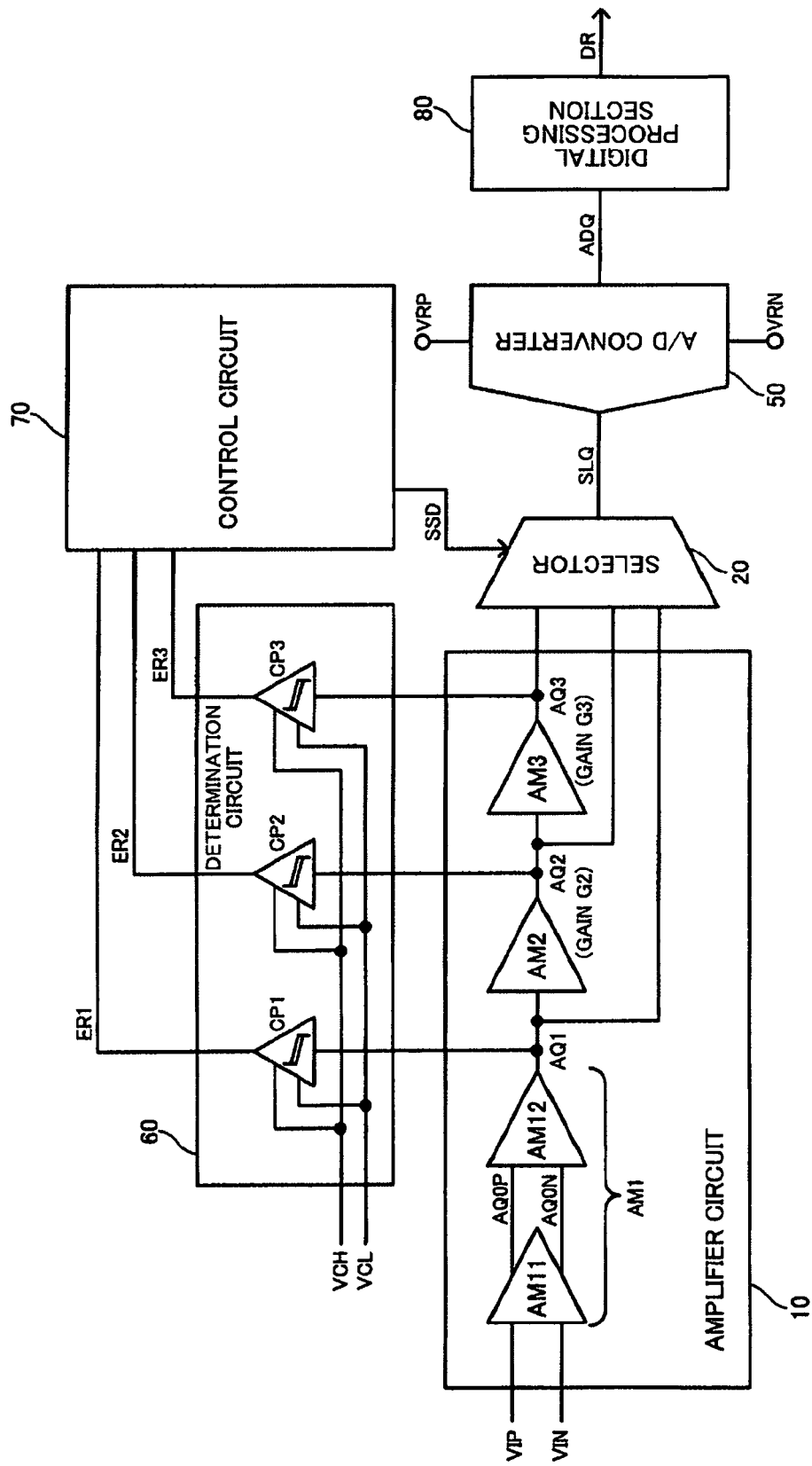
FIG. 13 shows a detailed third configuration example of an A/D conversion circuit according to one embodiment of the invention.

FIG. 13 shows a third configuration example of the A/D conversion circuit according to this embodiment. In the third configuration example, a digital processing section 80 is provided in addition to the elements of the first configuration example shown in FIG. 4. Note that the digital processing section 80 may be provided in the second configuration example shown in FIG. 9.

The digital processing section 80 is provided in the subsequent stage of the A/D converter 50. The digital processing section 80 performs a calculation process based on the digital data ADQ output from the A/D converter 50. Specifically, the digital processing section 80 performs a calculation process that differs corresponding to the output signal (input signal) selected by the selector 20 from the output signals output from the amplifiers AM1, AM2, and AM3. For example, the digital calculation process performed on the digital data ADQ by the digital processing section 80 when the output signal AQ1 output from the amplifier AM1 has been selected differs from the digital calculation process performed on the digital data ADQ by the digital processing section 80 when the output signal AQ2 output from the amplifier AM2 has been selected.

Figure 14A:
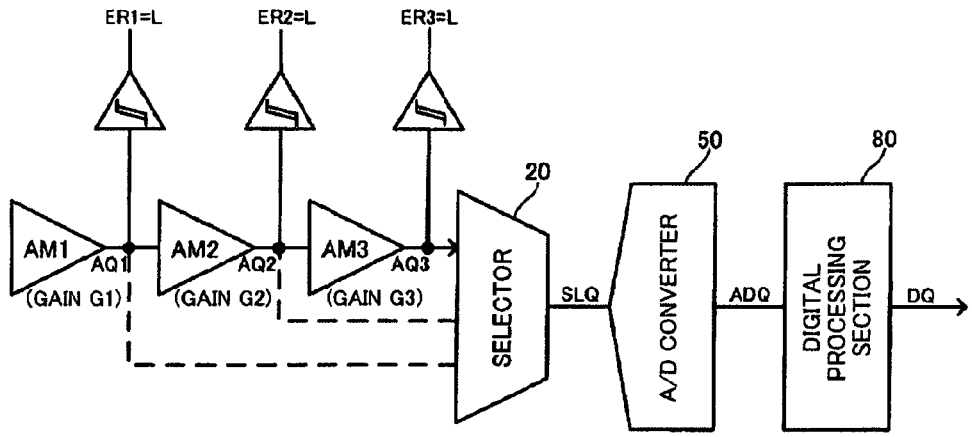
FIGS. 14A to 14C are views illustrative of the operation according to a third configuration example.

In FIG. 14A, the output signal AQ3 output from the amplifier AM3 ((j−1)th amplifier) among the amplifiers AM1 to AM3 is selected by the selector 20, for example. In this case, the digital processing section 80 performs a calculation process (e.g., bit-shift process) that multiplies the digital data ADQ output from the A/D converter 50 by a multiplication coefficient corresponding to the reciprocal 1/GTL of the total gain GTL of the amplifiers AM1 to AM3 (first to (j−1)th amplifiers). Specifically, when the gains of the amplifiers AM1, AM2, and AM3 are referred to as G1, G2, and G3, respectively, the total gain GTL is expressed by GTL=G1× G2×G3. The digital processing section 80 multiplies the digital data ADQ by the multiplication coefficient 1/GTL=1/ (G1×G2×G3) (reciprocal of the total gain GTL). Note that the multiplication coefficient may be set on the assumption that the gain G1 of the first-stage amplifier AM1 is one (G1=1).

Figure 14B:
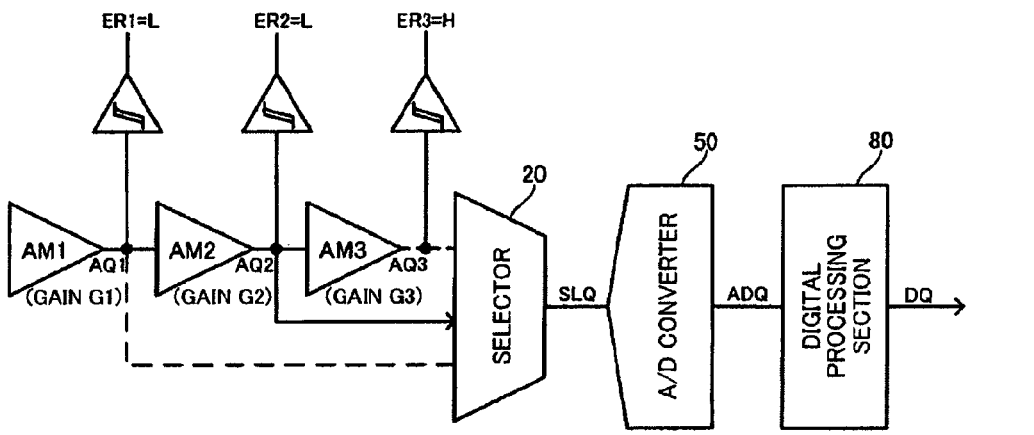

In FIG. 14B, the output signal AQ2 output from the amplifier AM2 is selected by the selector 20. In this case, the digital processing section 80 performs a calculation process that multiplies the digital data ADQ by the multiplication coefficient corresponding to the reciprocal 1/GTL of the total gain GTL of the amplifiers AM1 and AM2. Specifically, the total gain GTL is expressed by GTL=G1×G2, and the digital processing section 80 multiplies the digital data ADQ by the multiplication coefficient 1/GTL=1/(G1×G2) (reciprocal of the total gain GTL).

Figure 14C:
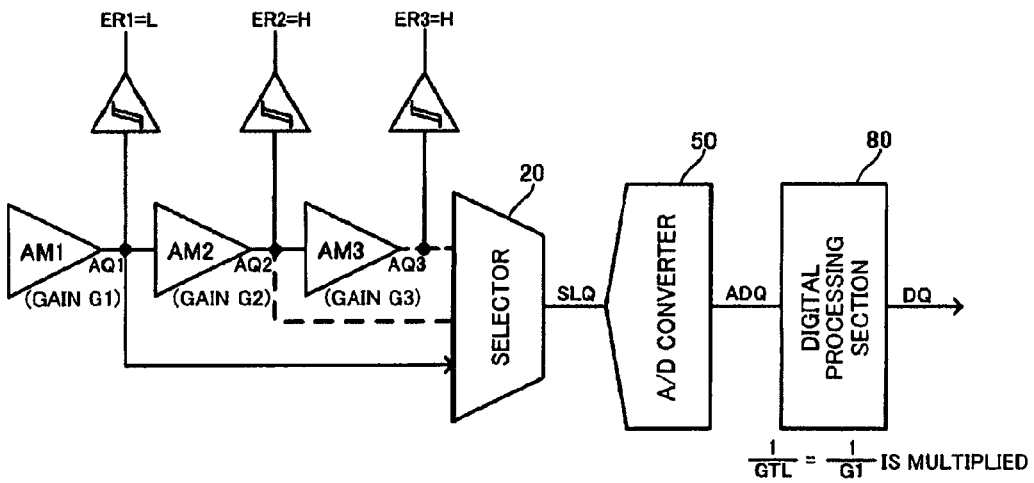

In FIG. 14C, the output signal AQ1 output from the amplifier AM1 is selected by the selector 20. In this case, the total gain GTL is expressed by GTL=G1. When the gain G1 of the amplifier AM1 is regarded as one, the multiplication coefficient 1/GTL is one (1/GTL=1). Therefore, the digital processing section 80 does not perform the multiplication process (bit-shift process).

Figure 15A:
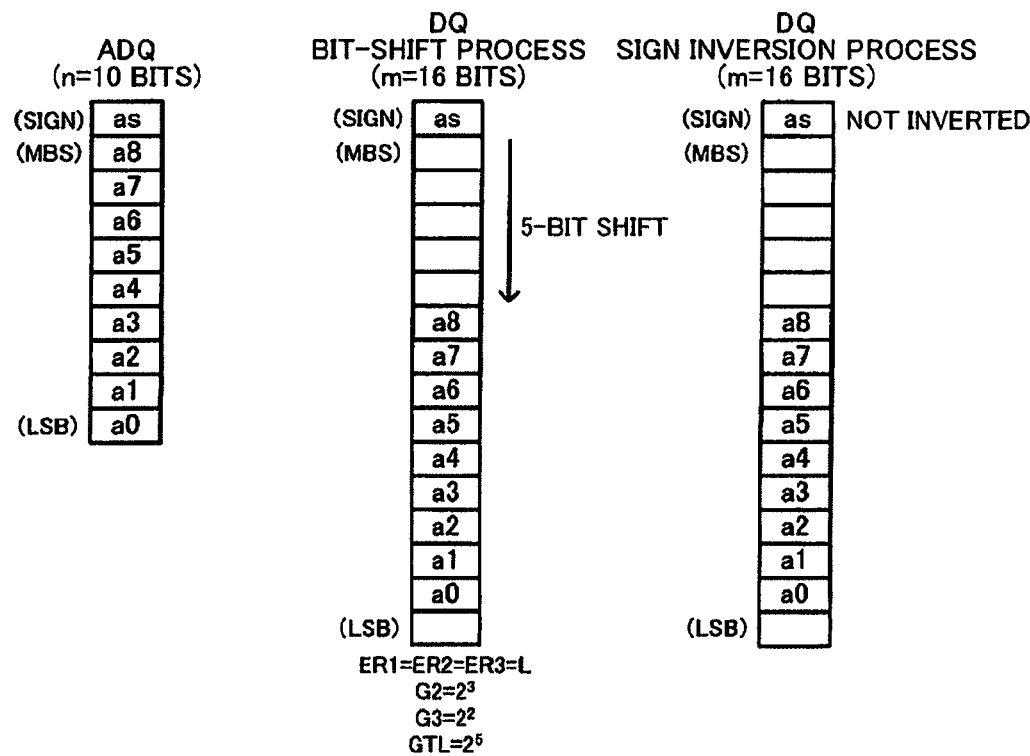
FIGS. 15A and 15B are views illustrative of digital processing according to one embodiment of the invention.
Figure 15B:
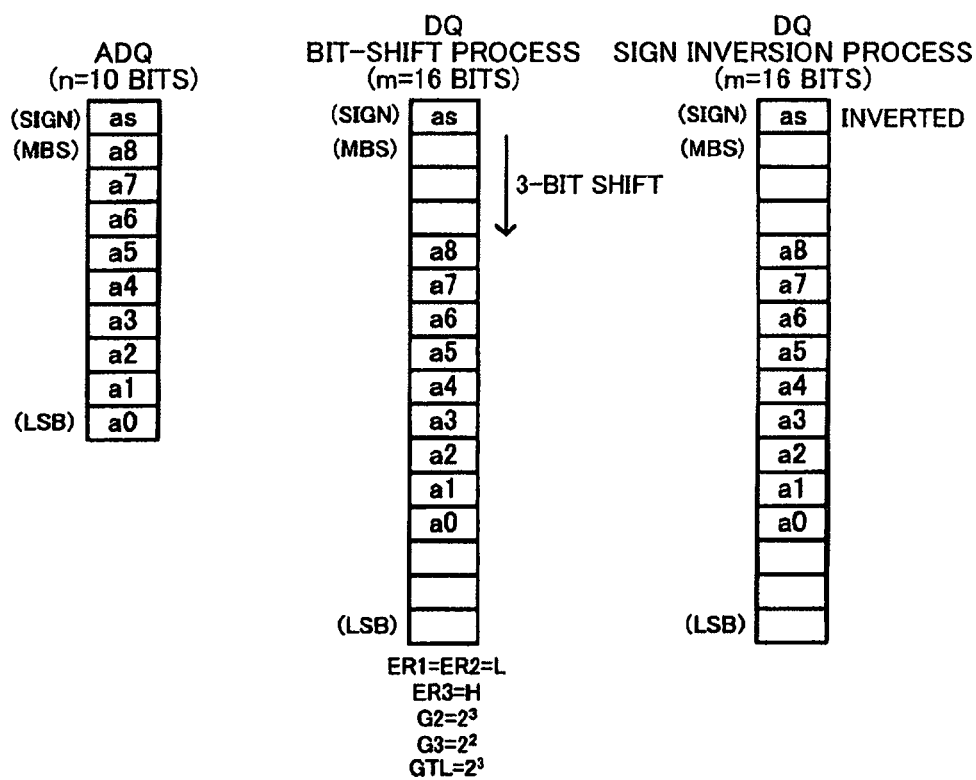
Figure 16:
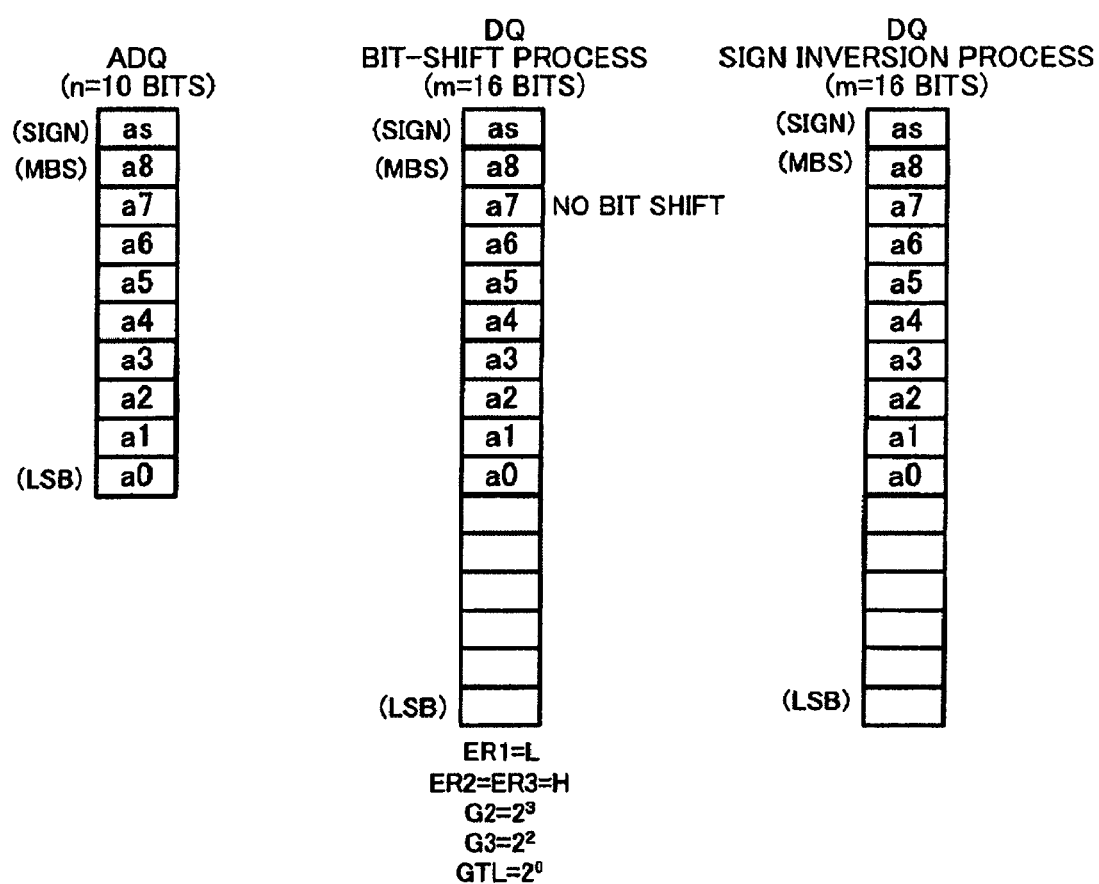
FIG. 16 is a view illustrative of digital processing according to one embodiment of the invention.

A specific example of the calculation process of the digital processing section 80 is described below with reference to FIGS. 15A to 16. In FIG. 15A, the resolution of the A/D conversion circuit 50 is 10 bits (n bits in a broad sense; n is an integer equal to or larger than two), for example. In this case, the digital processing section 80 performs the calculation process based on the 10-bit (n-bit) digital data ADQ output from the A/D converter 50, and outputs 16-bit (m-bit in a broad sense; m is an integer larger than n (m>n)) digital data DQ, for example. Specifically, the digital processing section 80 increases the number of bits from 10 bits to 16 bits.

For example, when using a method that increases the A/D conversion dynamic range by making the A/D input amplitude (swing level) constant by means of a gain adjustment and an offset adjustment, as described with reference to FIG. 2, the gain adjustment amount and the offset adjustment amount change corresponding to the input signal. Therefore, the voltage level indicated by the digital data ADQ obtained by A/D conversion also changes corresponding to the gain adjustment amount and the offset adjustment amount. Therefore, it is not desirable to directly transmit the digital data to a system in the subsequent stage.

According to this embodiment, since the 10-bit digital data ADQ is converted into the 16-bit digital data DQ, the digital data DQ that indicates a correct A/D conversion voltage level can be transmitted to the system even when performing the gain adjustment and the like.

In FIG. 15A, the digital data ADQ obtained by A/D conversion is 10-bit (n-bit) data. Bits a0 to a8 form a bit string that indicates an absolute value (i.e., the absolute value of the voltage level), and a bit as is a sign bit that indicates a sign. The gains G2 and G3 of the amplifiers AM2 and AM3 shown in FIG. 13 are set at a power of two. Specifically, the gain G2 is set at $2^3$, and the gain G2 is set at $2^2$.

When the output signal AQ3 output from the amplifier AM3 is selected by the selector 20 (see FIG. 14A), the error signals ER1, ER2, and ER3 are set at the L level, and the total gain GTL is expressed by GTL=G2×G3=$2^3$×$2^2$=$2^5$ (provided that G1=1). In this case, the digital processing section 80 performs a 5-bit-shift process as the process that multiplies the digital data ADQ by the multiplication coefficient corresponding to the reciprocal of the total gain GTL (=$2^5$), as shown in FIG. 15A. Specifically, the digital processing section 80 performs a bit-shift process that multiplies the voltage level of the signal that has been gain-adjusted by a factor of $2^2$×$2^3$×=$2^5$ using the amplifier AM2 (gain G2=$2^3$) and the amplifier AM3 (gain G3=$2^2$) by 1/$2^5$ to recover the original voltage level.

When the output signal AQ2 output from the amplifier AM2 is selected by the selector 20 (see FIG. 14B), the error signals ER1 and ER2 are set at the L level, and the error signal ER3 is set at the H level. The total gain GTL is expressed by GTL=G3=$2^3$. In this case, the digital processing section 80 performs a 3-bit-shift process as the process that multiplies the digital data ADQ by the multiplication coefficient corresponding to the reciprocal of the total gain GTL (=$2^3$), as shown in FIG. 15B. Specifically, the digital processing section 80 performs a bit-shift process that multiplies the voltage level of the signal that has been gain-adjusted by a factor of 23 using the amplifier AM2 (gain G2=$2^3$) by 1/$2^3$ to recover the original voltage level.

When the output signal AQ3 is selected by the selector 20 (see FIG. 14C), the error signal ER1 is set at the L level, and the error signals and ER2 and ER3 are set at the H level. The total gain GTL is expressed by GTL=$2^0$=1. In this case, the digital processing section 80 does not perform a bit-shift process, as shown in FIG. 16.

As described above, the digital processing section 80 shifts at least the bit string a0 to a8 that is included in the m-bit (e.g., 16-bit) digital data DQ and indicates the absolute value by the number of bits (e.g., 5 bits) determined corresponding to the output signal selected by the selector 20 from the output signals output from the amplifiers AM1, AM2, and AM3.

The voltage level indicated by the digital data DQ does not depend on the gain adjustment amount ($2^5$) as a result of performing the above-described bit-shift process. Therefore, the system in the subsequent stage that has received the digital data DQ can disregard the gain adjustment. Since a signal having a large amplitude (A5 in FIG. 2) can be input to the A/D converter 50, even if the amplitude of the input signal is small (A3 in FIG. 2), by performing a gain adjustment by a factor of $2^5$, the dynamic range can be increased (B2 in FIG. 3).

In FIG. 13, the amplifiers AM2 and AM3 are formed by the inverting amplifiers described with reference to FIGS. 11 and 12. Since it is unnecessary to use a rail-to-rail operational amplifier by utilizing the inverting amplifiers as the amplifiers AM2 and AM3, a reduction in circuit scale and an improvement in the characteristics of the operational amplifier can be achieved. In this case, the sign of the 16-bit digital data DQ changes corresponding to the output signal selected by the selector 20 when no measures are taken.

Therefore, the digital processing section 80 performs a process (inversion/non-inversion process) that sets the sign bit as of the 16-bit (m-bit) digital data corresponding to the output signal selected by the selector 20A from the output signals Q2 and AQ3 output from the amplifiers AM2 and AM3.

For example, when the output signal AQ3 output from the amplifier AM3 is selected by the selector 20 (FIG. 14A), the selector output signal SLQ is a signal that has passed through the inverting amplifiers AM2 and AM3. In this case, the digital processing section 80 does not invert the sign bit as, as shown in FIG. 15A.

When the output signal AQ2 output from the amplifier AM2 is selected by the selector 20 (FIG. 14B), the selector output signal SLQ is a signal that has passed through the inverting amplifier AM2. In this case, the digital processing section 80 inverts the sign bit as, as shown in FIG. 15B.

When the output signal AQ1 output from the amplifier AM1 is selected by the selector 20 (FIG. 14C), the selector output signal SLQ has not passed through the inverting amplifiers AM2 and AM3. In this case, the digital processing section 80 does not invert the sign bit as, as shown in FIG. 16.

According to this configuration, since an appropriate sign bit as is set corresponding to the signal AQ1, AQ2, or AQ3 selected by the selector 20, consistent 16-bit digital data DQ with a sign bit can be transmitted to the system.

The calculation process performed by the digital processing section 80 is not limited to the above-described bit-shift process and sign setting process. The digital processing section 80 may perform various processes necessary for the system to disregard the gain adjustment and the offset adjustment.

6. Electronic Instrument

An electronic instrument according to one embodiment of the invention is described below with reference to FIGS. 17A to 17C. The electronic instrument according to this embodiment is not limited to the configurations shown in FIGS. 17A to 17C. Various modification may be made such as omitting some of the elements or adding other elements.

Figure 17A:
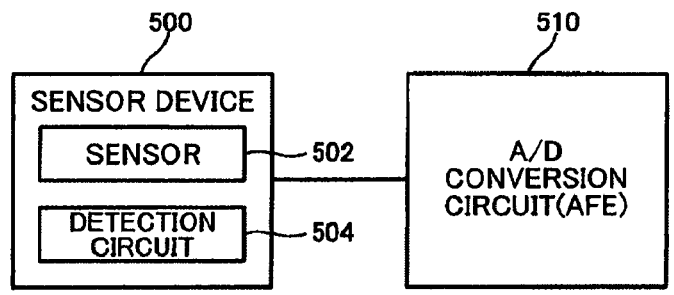
FIGS. 17A to 17C show configuration examples of an electronic instrument according to one embodiment of the invention.

FIG. 17A shows a first configuration example of the electronic instrument according to this embodiment. The electronic instrument according to the first configuration example includes a sensor device 500, and an A/D conversion circuit 510 (analog front-end (AFE) circuit) according to the above embodiment. In the electronic instrument shown in FIG. 17A, the sensor device 500 (physical quantity transducer) detects various physical quantities (e.g., force, acceleration, and mass). The sensor device 500 converts the physical quantity into a current (charge), a voltage, or the like, and outputs the current, voltage, or the like as a detection signal. The sensor device 500 includes a sensor 502 and a detection circuit 504. Note that the sensor device 500 may not include the detection circuit 504.

The A/D conversion circuit 510 receives the detection signal output from the sensor device 500, subjects the detection signal to A/D conversion, and optionally performs a calculation process (signal processing) on digital data obtained by A/D conversion. The A/D conversion circuit 510 outputs the resulting digital data to a system (system board or system device such as a CPU) in the subsequent stage.

According to the first configuration example shown in FIG. 17A, various electronic instruments that include a smoke sensor, an optical sensor, a human detection sensor, a pressure sensor, a biosensor, a gyrosensor, and the like can be implemented.

Figure 17B:
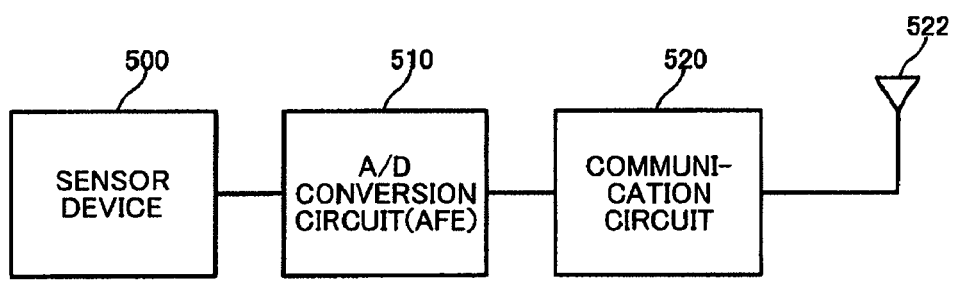

FIG. 17B shows a second configuration example of the electronic instrument according to this embodiment. In the second configuration example, a communication circuit (radio circuit) 520 and an antenna 522 are provided in addition to the first configuration example shown in FIG. 17A. The communication circuit 520 performs a modulation process and the like on the digital data output from the A/D conversion circuit 510, and transmits the resulting data to an external instrument (target-side electronic instrument) using the antenna 522. The communication circuit 520 may receive data from an external instrument using the antenna 522, and perform an ID authentication process or control the sensor device 500, for example.

According to the second configuration example shown in FIG. 17B, electronic instruments such as an IC tag (RF tag) used for radio frequency identification (RFID) that writes and reads data in a contactless manner utilizing wireless communication can be implemented in addition to the electronic instruments that can be implemented by the first configuration example shown in FIG. 17A, for example.

Figure 17C:
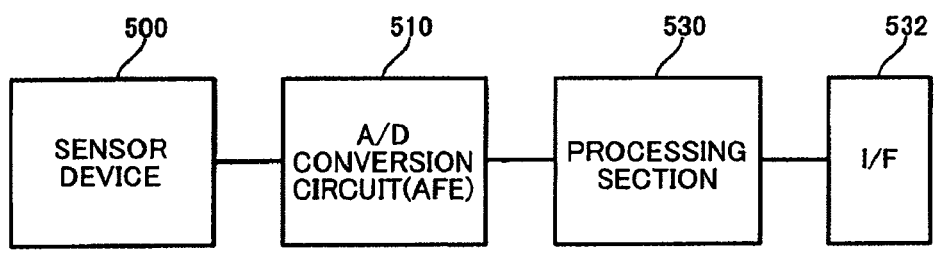

FIG. 17C shows a third configuration example of the electronic instrument according to this embodiment. The electronic instrument shown in FIG. 17C includes a processing section 530 and an interface (I/F) 532 in addition to the elements of the first configuration example shown in FIG. 17A. The processing section 530 receives the digital data output from the A/D conversion circuit 510, and performs various processes. The I/P 532 performs data transfer conforming to the USB standard, the IEEE 1394 standard, or the like to and from an external instrument such as a personal computer (PC).

According to the third configuration example shown in FIG. 17C, electronic instruments such as an evaluation device (evaluation board) used for development and trial production of the sensor device 500 can be implemented in addition to the electronic instruments that can be implemented by the first and second configuration examples shown in FIGS. 17A and 17B.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The configurations and the operations of the A/D conversion circuit and the electronic instrument are not limited to those described in the above embodiments. Various modifications and variations may be made.

What is claimed is:

1. An A/D conversion circuit comprising:
   an amplifier circuit that includes a plurality of amplifiers and receives an input signal, the plurality of amplifiers being cascaded;
   a selector that selects one of output signals output from the plurality of amplifiers and outputs the selected output signal as a selector output signal;
   an A/D converter that A/D-converts the selector output signal output from the selector;
   a determination circuit that determines whether or not a voltage of the output signal output from each of the plurality of amplifiers is within a determination voltage range specified by a high-potential-side determination voltage and a low-potential-side determination voltage; and
   a control circuit that instructs the selector to select one of the output signals output from the plurality of amplifiers based on the determination result of the determination circuit.

2. The A/D conversion circuit as defined in claim 1,
   the high-potential-side determination voltage being set at a voltage equal to or lower than a high-potential-side reference voltage that specifies an input voltage range of the A/D converter; and
   the low-potential-side determination voltage being set at a voltage equal to or higher than a low-potential-side reference voltage that specifies the input voltage range of the A/D converter.

3. The A/D conversion circuit as defined in claim 1,
   the amplifier circuit including first to Nth amplifiers as the plurality of amplifiers; and
   the control circuit instructing the selector to select an output signal output from a (j−1)th (j is an integer that satisfies $1<j\leq N$) amplifier among the first to Nth amplifiers when the determination circuit has determined that a voltage of an output signal output from a jth amplifier among the first to Nth amplifiers is not within the determination voltage range.

4. The A/D conversion circuit as defined in claim 1,
   the amplifier circuit including first to Nth amplifiers as the plurality of amplifiers; and
   the control circuit instructing the selector to select an output signal output from a (j−1)th (j is an integer that satisfies $1<j\leq N$) amplifier among the first to Nth amplifiers when the determination circuit has determined that a voltage of an input signal input to a jth amplifier among the first to Nth amplifiers is not within a Jth determination voltage range that is set corresponding to a gain of the jth amplifier.

5. The A/D conversion circuit as defined in claim 1,
the plurality of amplifiers including a plurality of amplifiers of which the gains are set at a power of two.

6. The A/D conversion circuit as defined in claim 1,
the plurality of amplifiers including a plurality of inverting amplifiers that are cascaded.

7. The A/D conversion circuit as defined in claim 6,
each of the plurality of inverting amplifiers including:
an operational amplifier, an output terminal of the operational amplifier being connected to an output node of the inverting amplifier;
a first resistor provided between a first input terminal of the operational amplifier and an input node of the inverting amplifier; and
a second resistor provided between the output node and the first input terminal of the operational amplifier.

8. The A/D conversion circuit as defined in claim 1,
the amplifier circuit including a differential amplifier as a first-stage amplifier of the plurality of amplifiers, the differential amplifier differentially amplifying differential input signals.

9. The A/D conversion circuit as defined in claim 1,
the determination circuit including a plurality of comparators, each of the plurality of comparators comparing the voltage of the output signal output from a corresponding amplifier among the plurality of amplifiers with the high-potential-side determination voltage and the low-potential-side determination voltage.

10. The A/D conversion circuit as defined in claim 9,
each of the plurality of comparators being a comparator that has a hysteresis function.

11. The A/D conversion circuit as defined in claim 1, further comprising:
a digital processing section that is provided in a subsequent stage of the A/D converter and performs a calculation process based on digital data output from the A/D converter,
the digital processing section performing a calculation process that differs corresponding to which output signal is selected by the selector from among the output signals output from the plurality of amplifiers.

12. The A/D conversion circuit as defined in claim 11,
the amplifier circuit including first to Nth amplifiers as the plurality of amplifiers; and
the digital processing section performing a calculation process that multiplies the digital data output from the A/D converter by a multiplication coefficient corresponding to a reciprocal of a total gain of the first amplifier to a (j−1)th (j is an integer that satisfies $1<j\leq N$) amplifier among the first to Nth amplifiers when the selector has selected an output signal output from the (j−1)th amplifier.

13. The A/D conversion circuit as defined in claim 11,
when the resolution of the A/D converter is n bits (n is an integer equal to or larger than two), the digital processing section performing the calculation process based on n-bit digital data output from the A/D converter, and outputting m-bit (m is an integer larger than n ($m>n$)) digital data.

14. The A/D conversion circuit as defined in claim 13,
the plurality of amplifiers including a plurality of amplifiers of which the gains are set at a power of two; and
the digital processing section shifting at least a bit string that is included in the m-bit digital data and indicates an absolute value by a number of bits, the number of bits being determined corresponding to which output signal is selected by the selector from among the output signals output from the plurality of amplifiers.

15. The A/D conversion circuit as defined in claim 13,
the plurality of amplifiers including a plurality of inverting amplifiers that are cascaded; and
the digital processing section setting a sign bit of the m-bit digital data corresponding to which output signal is selected by the selector from among the output signals output from the plurality of amplifiers.

16. An electronic instrument comprising the A/D conversion circuit as defined in claim 1.

* * * * *